(12) United States Patent
Sugiyama

(10) Patent No.: US 10,714,885 B2
(45) Date of Patent: Jul. 14, 2020

(54) METHOD OF MAKING A PLURALITY OF PRINTED CIRCUIT BOARDS FROM A SINGLE CIRCUIT BOARD SHEET

(71) Applicant: CANON KABUSHIKI KAISHA, Tokyo (JP)

(72) Inventor: Norikazu Sugiyama, Susono (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/531,556

(22) Filed: Aug. 5, 2019

(65) Prior Publication Data
US 2020/0052450 A1 Feb. 13, 2020

(30) Foreign Application Priority Data

Aug. 8, 2018 (JP) .................. 2018-149677

(51) Int. Cl.

| H01R 12/00 | (2006.01) |
|---|---|
| H01R 43/02 | (2006.01) |
| H01R 12/71 | (2011.01) |
| H01R 12/51 | (2011.01) |
| H01R 12/75 | (2011.01) |
| H05K 3/00 | (2006.01) |
| H05K 1/18 | (2006.01) |
| H05K 3/34 | (2006.01) |

(52) U.S. Cl.
CPC ......... *H01R 43/0256* (2013.01); *H01R 12/51* (2013.01); *H01R 12/716* (2013.01); *H01R 12/75* (2013.01); *H05K 1/181* (2013.01); *H05K 3/0097* (2013.01); *H05K 3/3415* (2013.01); *H05K 2201/1031* (2013.01); *H05K 2201/10356* (2013.01); *H05K 2203/302* (2013.01)

(58) Field of Classification Search
CPC .. H01R 43/0256; H01R 12/716; H01R 12/75; H01R 12/51; H05K 2203/302; H05K 2201/10356; H05K 3/0097; H05K 3/3415
USPC ........................................................ 439/83
See application file for complete search history.

(56) References Cited

U.S. PATENT DOCUMENTS

| 3,454,774 A | * | 7/1969 | Wizenick ............ H01L 31/0508 136/244 |
|---|---|---|---|
| 2011/0024786 A1 | * | 2/2011 | Sugiyama ............. H01L 33/486 257/99 |
| 2018/0082938 A1 | * | 3/2018 | Chan ...................... H05K 1/115 |

FOREIGN PATENT DOCUMENTS

| JP | 2005-026246 A | 1/2005 |
|---|---|---|
| JP | 2005-044855 A | 2/2005 |

* cited by examiner

*Primary Examiner* — Jean F Duverne
(74) *Attorney, Agent, or Firm* — Venable LLP

(57) ABSTRACT

A solder paste is printed on a first surface of a sheet. Connectors are mounted on a first surface of a first board and a second surface of a second board. The sheet is inverted. A solder paste is printed on a second surface of the sheet. Connectors are mounted on a second surface of the first board and a first surface of the second board. The solder paste printed onto the second surface of the sheet is melted. The first board is separated from the second board. The first and second board have the same connector layout. A first connector soldered to the first surface of the first board and a second connector soldered to the second surface of the second board are disposed at a location where the sheet can be bent and broken along the separation line.

28 Claims, 13 Drawing Sheets

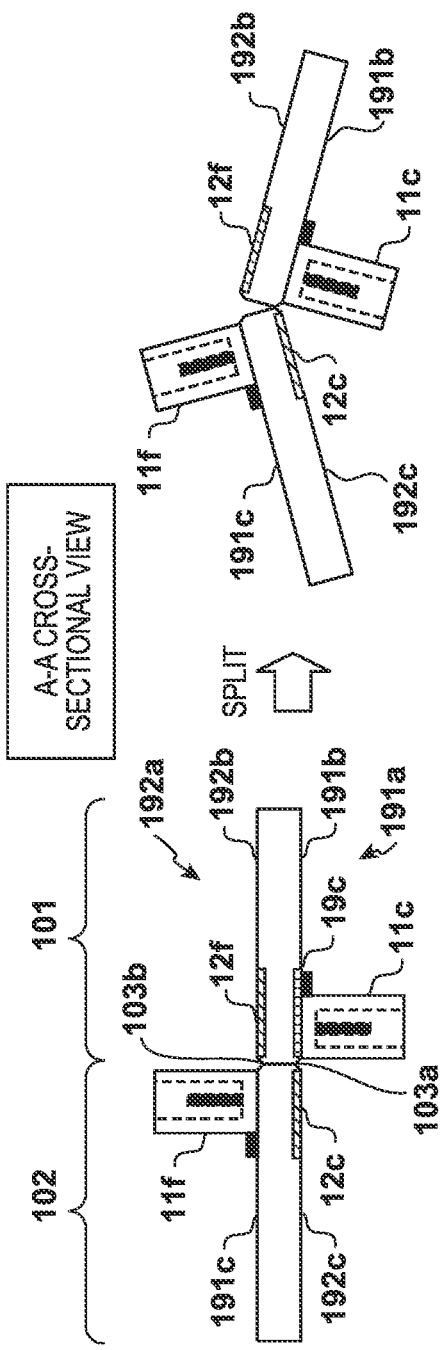
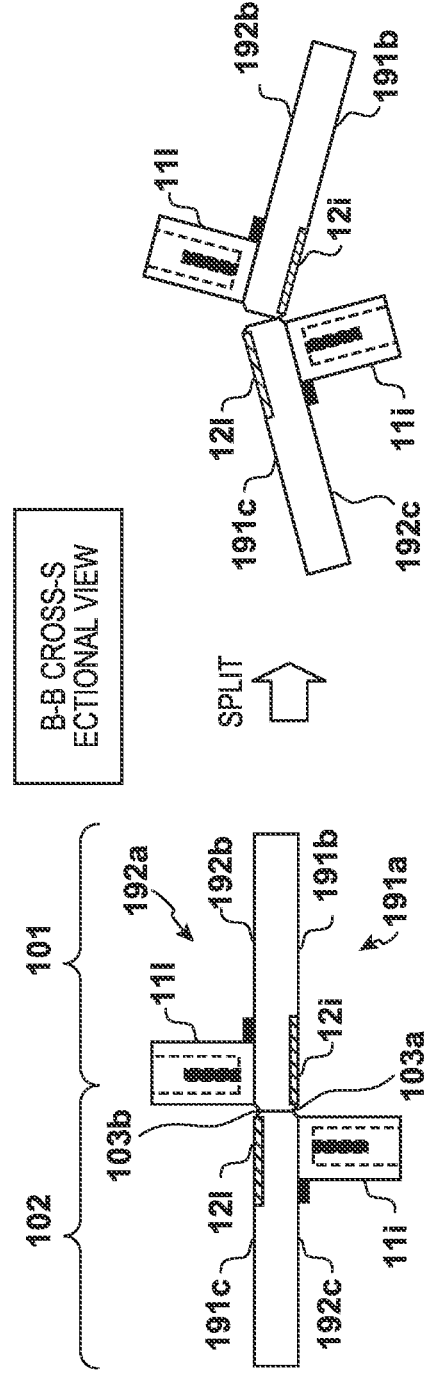

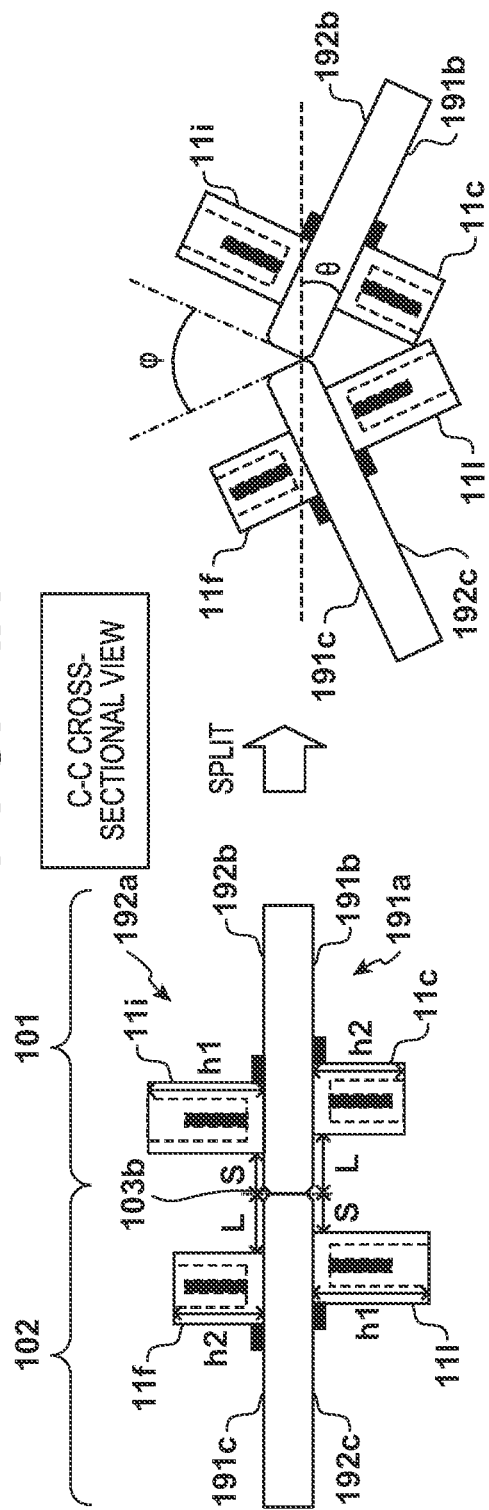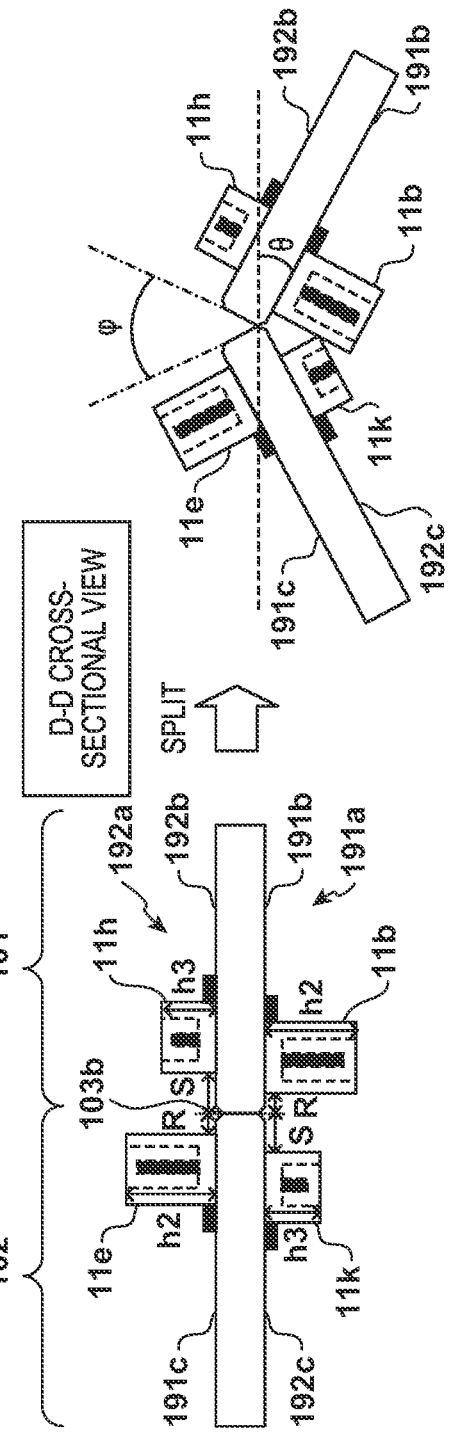

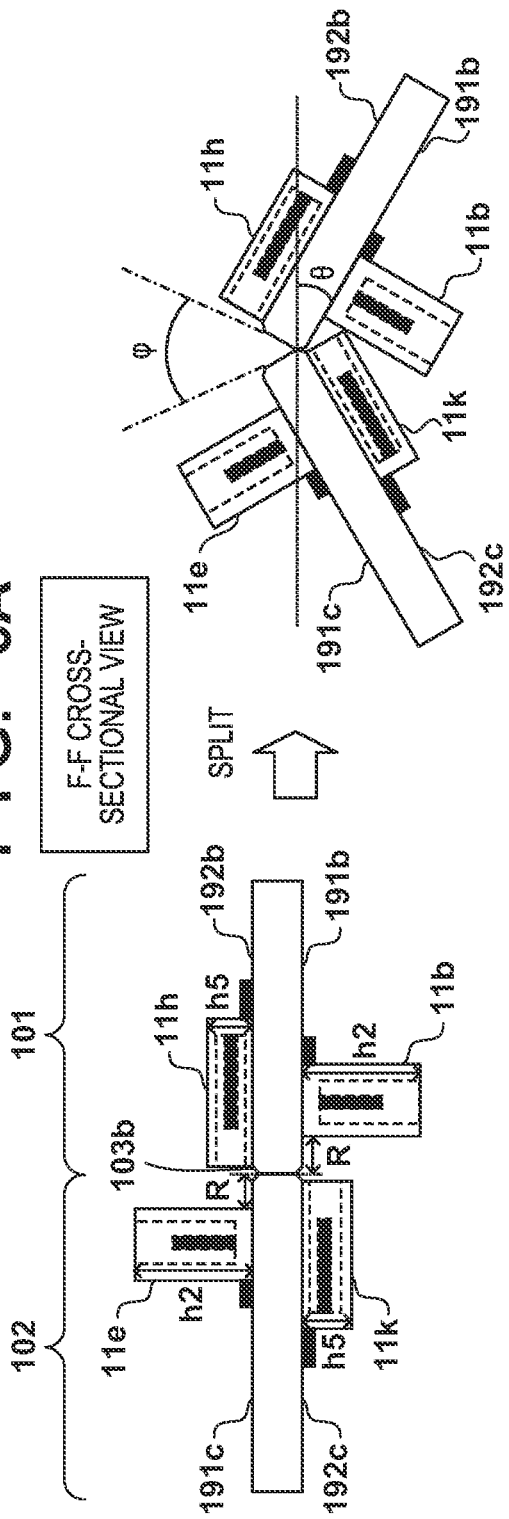
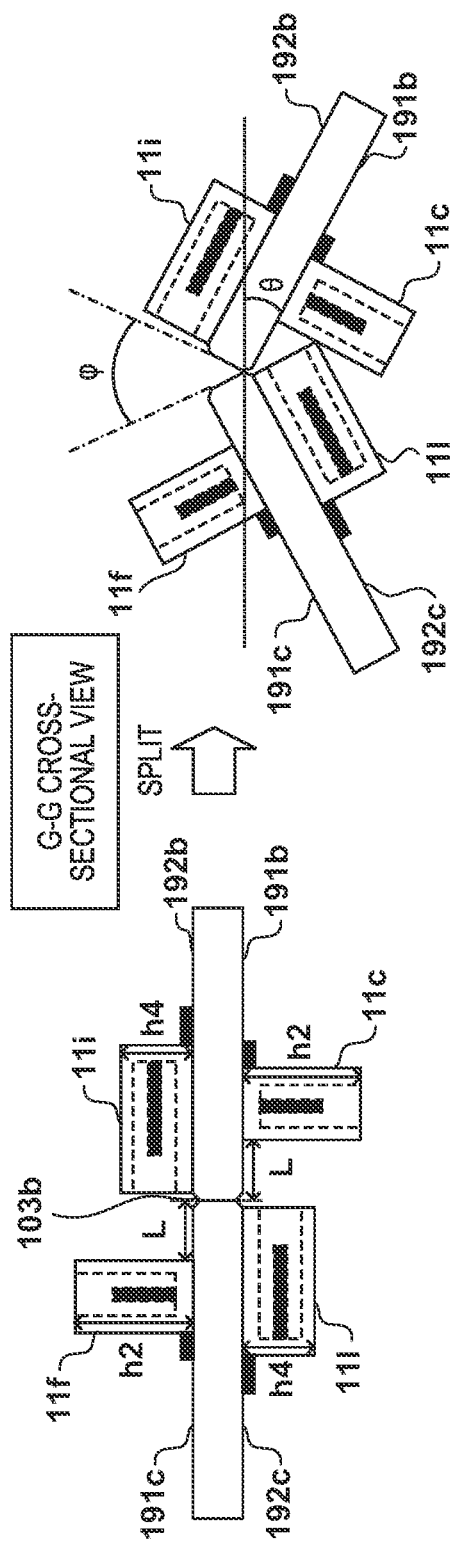

METHOD OF MAKING A PLURALITY OF PRINTED CIRCUIT BOARDS FROM A SINGLE CIRCUIT BOARD SHEET

BACKGROUND OF THE INVENTION

Field of the Invention

The present invention relates to a method of making a plurality of printed circuit boards from a single circuit board sheet.

Description of the Related Art

Various types of connectors are arranged on printed circuit boards. Japanese Patent Laid-Open No. 2005-26246 discloses mounting surface-mounted connectors on a printed circuit board. Such connectors are soldered to the surface of the printed circuit board in a reflow oven. Using surface-mounted connectors eliminates the need for through-holes for inserting the terminals of the connectors into the printed circuit board. Japanese Patent Laid-Open No. 2005-44855 discloses reversible imposition. Generally speaking, a method of mass-producing multiple printed circuit boards having the same circuit configuration by dividing a single circuit board sheet is called "imposition". "Reversible imposition" is imposition in which the layout pattern of electronic components mounted on the front surface of a circuit board sheet is made the same as the layout pattern of electronic components mounted on the rear surface of the sheet, which allows the same metal mask to be used for both the front and rear surfaces of the sheet. Reversible imposition can reduce the number of metal masks, cut down on the mounting data required by the mounter, and shorten the lead time of the solder paste printing process.

A circuit board sheet is typically manually bent using separation lines as boundaries in order to separate the sheet into multiple printed circuit boards. Furthermore, the front surface of one printed circuit board and the rear surface of another printed circuit board are formed on the front surface of the circuit board sheet. The rear surface of the circuit board sheet appears when the circuit board sheet is rotated using the separation line as an axis of rotation. The rear surface of one printed circuit board and the front surface of another printed circuit board are formed on the rear surface of the circuit board sheet. It is assumed here that each printed circuit board is quadrangular in shape and has four sides (end parts). In this case, one of the sides is formed by a separation line (a cut face). A side parallel to the one side will be called the "other side". Although surface-mounted connectors can be mounted on both the front and rear surfaces of a printed circuit board, such connectors cannot be disposed near the other side. It is generally necessary for both ends of a circuit board sheet to be held between rails when transporting the circuit board sheet within a reflow oven. In other words, the vicinity of the other side of the printed circuit board is used as a holding region held between the rails, and thus connectors cannot be disposed in that region. The holding region is cut away and discarded as a throwaway board, which wastes resources and adds the task of cutting to the process. The surface area of the circuit board sheet that can actually be used as a printed circuit board is also reduced, which reduces the number of printed circuit boards that can be obtained from a single circuit board sheet. Accordingly, it is conceivable to dispose the connectors on the sides of the printed circuit board located toward the separation lines. In this case, the front surface of one printed circuit board and the rear surface of another printed circuit board are located on the same plane, and the groups of connectors arranged on the two boards are near each other, with the separation line therebetween. A plurality of connectors are nearby each other, with a separation line located therebetween, on the front surface of the circuit board sheet, and a plurality of connectors are nearby each other, with a separation line located therebetween, on the rear surface of the circuit board sheet as well. When a worker bends the circuit board sheet in order to cut the sheet, the plurality of connectors disposed on both sides of the separation line interfere (collide) with each other. The interference between the plurality of connectors makes it impossible to bend the circuit board sheet to an angle at which the sheet can be cut.

SUMMARY OF THE INVENTION

The present invention provides a method for manufacturing a plurality of printed circuit boards, each board having the same connector layout, by dividing a single circuit board sheet, the method comprising: printing a solder paste on a first surface of the circuit board sheet; mounting one or more connectors on each of a first surface of a first printed circuit board and a second surface of a second printed circuit board which, of the plurality of printed circuit boards, are located on opposite sides of a separation line, the first surface of the first printed circuit board and the second surface of the second printed circuit board being located on the first surface of the circuit board sheet; melting the solder paste printed onto the first surface of the circuit board sheet by loading the circuit board sheet into a reflow oven; inverting the circuit board sheet that has been removed from the reflow oven; printing a solder paste on a second surface of the circuit board sheet; mounting one or more connectors to each of a second surface of the first printed circuit board and a first surface of the second printed circuit board located on the second surface of the circuit board sheet; melting the solder paste printed onto the second surface of the circuit board sheet by loading the circuit board sheet into the reflow oven; and separating the first printed circuit board from the second printed circuit board by bending and breaking the circuit board sheet along the separation line, wherein a first connector soldered to the first surface of the first printed circuit board and a second connector soldered to the second surface of the second printed circuit board are disposed at a location where the circuit board sheet can be bent and broken along the separation line.

Further features of the present invention will become apparent from the following description of exemplary embodiments (with reference to the attached drawings).

BRIEF DESCRIPTION OF THE DRAWINGS

FIGS. 2A and 2B are cross-sectional views illustrating the separation of a printed circuit board according to the first embodiment.

FIGS. 4A and 4B are cross-sectional views illustrating the separation of a printed circuit board according to the second embodiment.

FIGS. 6A and 6B are cross-sectional views illustrating the separation of a printed circuit board according to the third embodiment.

DESCRIPTION OF THE EMBODIMENTS

Embodiments will be described hereinafter in detail, with reference to the accompanying drawings. Note that the following embodiments are not intended to limit the invention as set forth in the scope of patent claims. Although several features are described in the embodiments, all of these features are not necessarily required for the invention, and multiple features may be combined as desired. Furthermore, in the accompanying drawings, the same or similar configurations are given the same reference signs, and redundant descriptions thereof will be omitted.

First Embodiment

Figure 1:
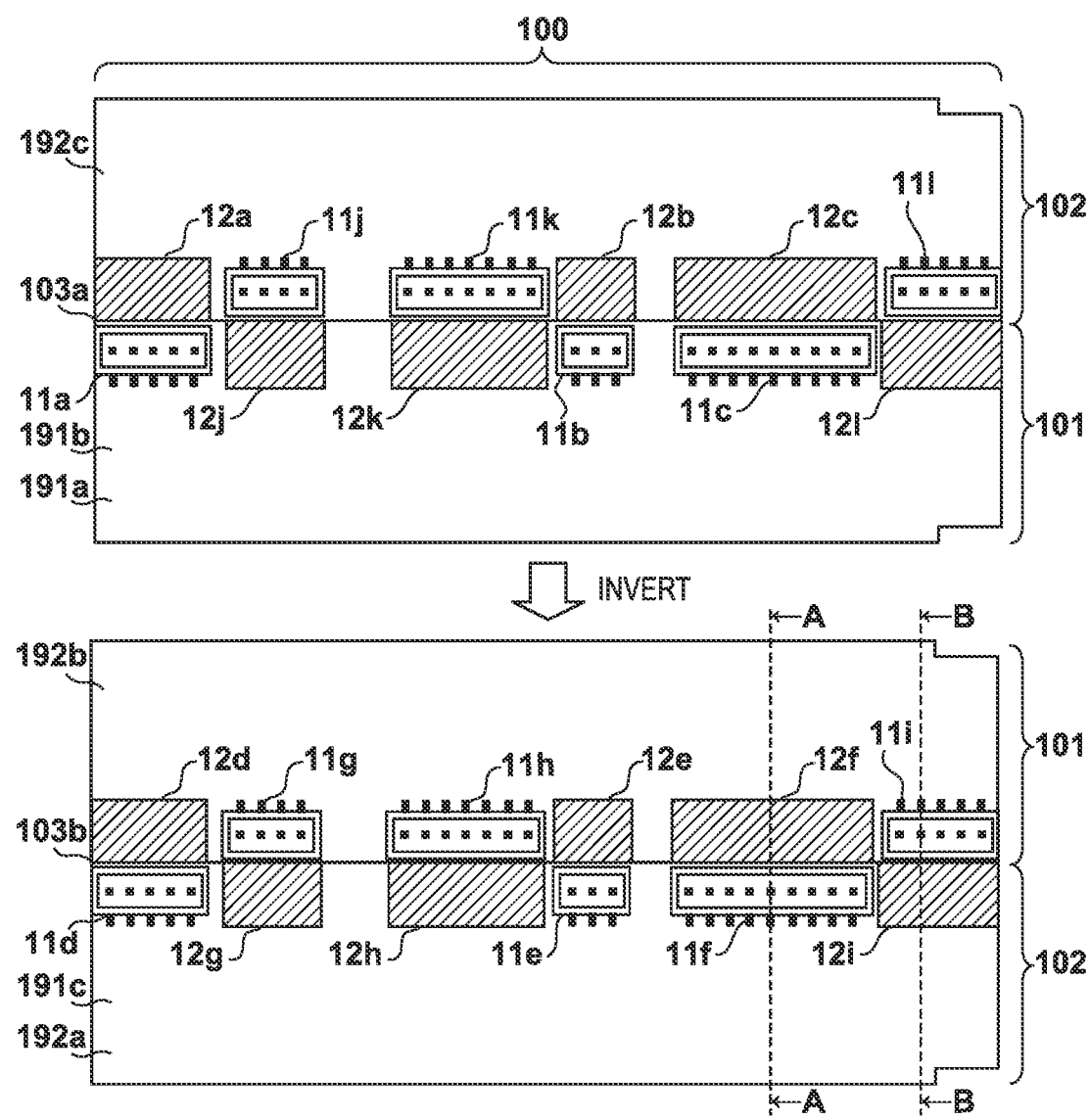
FIG. 1 is a diagram illustrating reversible imposition according to a first embodiment.

FIG. 1 is a diagram illustrating reversible imposition. Note that the reference signs are constituted by numbers and letters. When several reference signs having the same number refer to common items, the letters are dropped from the reference signs. A circuit board sheet 100 has a first printed circuit board 101 and a second printed circuit board 102. Separation lines 103a and 103b are provided between the first printed circuit board 101 and the second printed circuit board 102. The separation lines 103a and 103b are joints (perforations) or grooves (V-cuts) for making it easy to separate (split or cut) the first printed circuit board 101 and the second printed circuit board 102, for example. The circuit board sheet 100 has a front surface 191a and a rear surface 192a. The separation line 103a is provided on the front surface 191a of the circuit board sheet 100. The separation line 103b is provided on the rear surface 192a of the circuit board sheet 100. The first printed circuit board 101 has a front surface 191b and a rear surface 192b. The second printed circuit board 102 has a front surface 191c and a rear surface 192c.

The front surface 191b of the first printed circuit board 101 has connectors 11a, 11b, and 11c, which are disposed very close to the separation line 103a. The rear surface 192c of the second printed circuit board 102 has connectors 11j, 1k, and 11l, which are disposed very close to the separation line 103a. The rear surface 192b of the first printed circuit board 101 has connectors 11g, 11h, and 11i, which are disposed very close to the separation line 103b. The front surface 191c of the second printed circuit board 102 has connectors 11d, 11e, and 11f, which are disposed very close to the separation line 103b. The connectors 11a to 11l are all surface-mounted connectors.

On the front surface 191a of the circuit board sheet 100, a non-mounting region 12a is provided across from the region where the connector 11a is disposed, on the opposite side of the separation line 103a. A non-mounting region 12b is provided across from the region where the connector 11b is disposed, on the opposite side of the separation line 103a. A non-mounting region 12c is provided across from the region where the connector 11c is disposed, on the opposite side of the separation line 103a. The non-mounting regions 12a to 12c are provided on the rear surface 192c of the second printed circuit board 102.

On the front surface 191a of the circuit board sheet 100, a non-mounting region 12j is provided across from the region where the connector 11j is disposed, on the opposite side of the separation line 103a. A non-mounting region 12k is provided across from the region where the connector 11k is disposed, on the opposite side of the separation line 103a. A non-mounting region 12l is provided across from the region where the connector 11l is disposed, on the opposite side of the separation line 103a. The non-mounting regions 12j to 12l are provided on the front surface 191b of the first printed circuit board 101.

On the rear surface 192a of the circuit board sheet 100, a non-mounting region 12d is provided across from the region where the connector 11d is disposed, on the opposite side of the separation line 103b. A non-mounting region 12e is provided across from the region where the connector 11e is disposed, on the opposite side of the separation line 103b. A non-mounting region 12f is provided across from the region where the connector 11f is disposed, on the opposite side of the separation line 103b. The non-mounting regions 12d to 12f are provided on the rear surface 192b of the first printed circuit board 101.

On the rear surface 192a of the circuit board sheet 100, a non-mounting region 12g is provided across from the region where the connector 11g is disposed, on the opposite side of the separation line 103b. A non-mounting region 12h is provided across from the region where the connector 11h is disposed, on the opposite side of the separation line 103b. A non-mounting region 12i is provided across from the region where the connector 11i is disposed, on the opposite side of the separation line 103b. The non-mounting regions 12g to 12i are provided on the front surface 191c of the second printed circuit board 102.

The connector layout (the arrangement of the surface-mounted components) on the front surface 191a of the circuit board sheet 100 matches the connector layout on the rear surface 192a of the circuit board sheet 100. As such, the same metal mask can be used for both the front surface 191a and the rear surface 192a of the circuit board sheet 100. Furthermore, the connector layout on the front surface 191b of the first printed circuit board 101 matches the connector layout on the front surface 191c of the second printed circuit board 102. The connector layout on the rear surface 192b of the first printed circuit board 101 also matches the connector layout on the rear surface 192c of the second printed circuit board 102. As such, the first printed circuit board 101 and the second printed circuit board 102 are the same type of product, having the same connector layout.

FIG. 2A is an A-A cross-sectional view illustrating the separation of the printed circuit boards produced through reversible imposition. FIG. 2B is a B-B cross-sectional view illustrating the separation of the printed circuit boards produced through reversible imposition. The cut faces A-A and B-B are indicated in FIG. 1. It is assumed that the circuit board sheet 100 is folded in a mountain fold, by hand, central to the separation line 103b.

As illustrated in FIG. 2A, the connector 11c is soldered to a mounting region 19c on the front surface 191b of the first printed circuit board 101. Note that the connector mounting regions mentioned in the following descriptions are not illustrated. On the other hand, connectors are not mounted in the non-mounting region 12c of the second printed circuit board 102. Accordingly, even if the circuit board sheet 100 is mountain-folded at the separation line 103b, the connector 11c will not interfere with the connectors provided on the second printed circuit board 102. In other words, even if the circuit board sheet 100 is bent to an angle that enables the sheet to be cut, the connector 11c provided on the front surface 191b of the first printed circuit board 101 will not make contact with the connectors provided on the second printed circuit board 102. Likewise, the connector 11f will not make contact with other connectors.

As illustrated in FIG. 2B, connectors are not mounted in the non-mounting region 12i of the second printed circuit board 102. Accordingly, even if the circuit board sheet 100 is mountain-folded at the separation line 103b, the connector 11i provided on the rear surface 192c of the second printed circuit board 102 will not interfere with the connectors provided on the first printed circuit board 101. In other words, even if the circuit board sheet 100 is bent to an angle that enables the sheet to be cut, the connector 11i provided on the rear surface 192c of the second printed circuit board 102 will not make contact with the connectors provided on the first printed circuit board 101. Likewise, the connector 11l will not make contact with other connectors.

Second Embodiment

In the first embodiment, of two regions on the circuit board sheet 100 adjacent to each other with the separation line 103 therebetween, one of the regions serves as a connector mounting region, and the other serves as a non-mounting region. This suppresses interference between connectors and makes it possible to bend the circuit board sheet 100 and separate the sheet into a plurality of printed circuit boards. The second embodiment introduces a solution that is different from that described in the first embodiment. There are cases where both regions on the circuit board sheet 100 adjacent to each other with the separation line 103 therebetween serve as connector mounting regions. Connector layout conditions which ensure that even if the circuit board sheet 100 is bent in such a case, the connectors mounted in the one region will not interfere with the connectors mounted in the other region, will be described here. The "connector layout conditions" are defined by, for example, the height of the connectors, the distances from the ends of the connectors to the separation line, and the angle at which the circuit board sheet 100 can be cut (separated).

Figure 3:
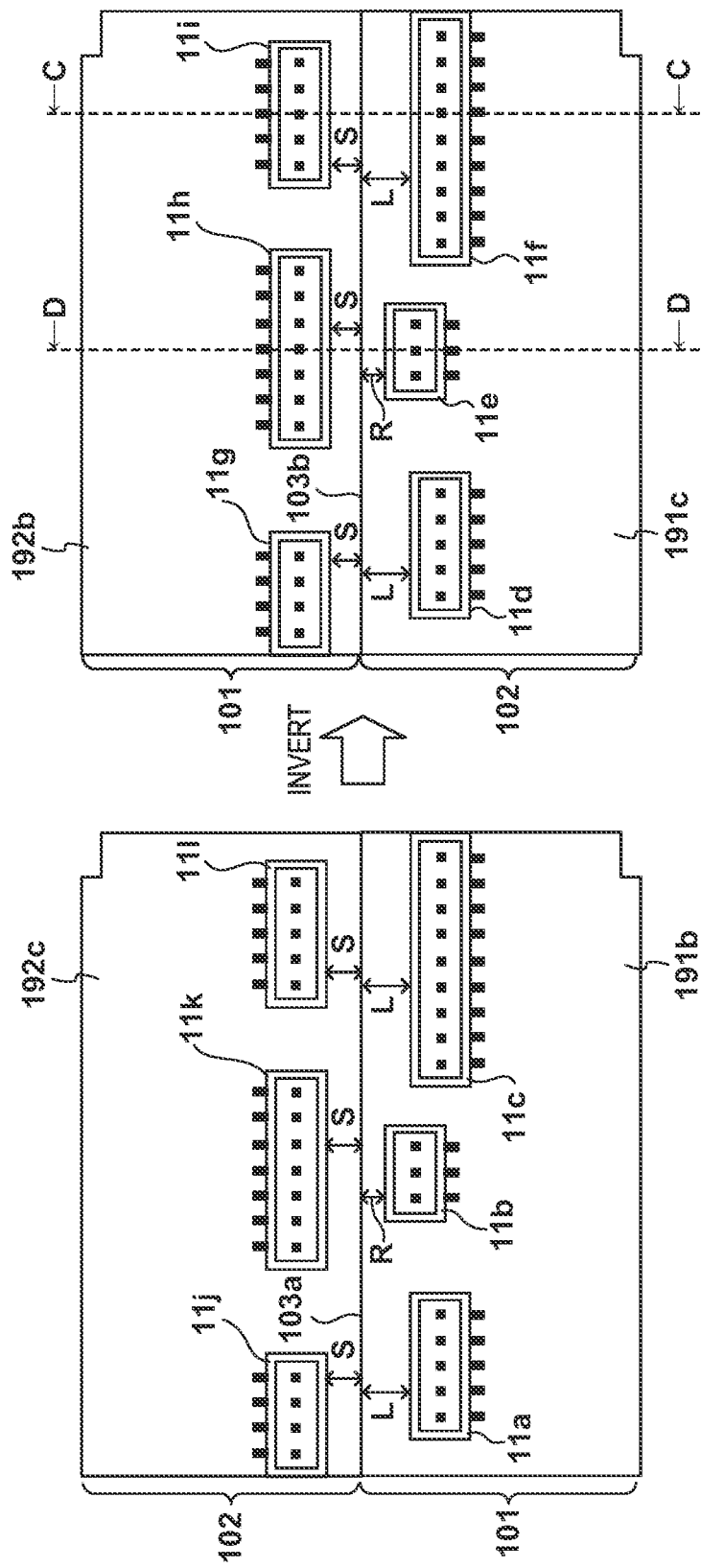
FIG. 3 is a diagram illustrating reversible imposition according to a second embodiment.

FIG. 3 is a diagram illustrating reversible imposition. In FIG. 3, parts that are the same as or similar to parts already described are given the same reference signs, and descriptions thereof will be omitted. As illustrated in FIG. 3, the connectors 11a to 11c are mounted on the front surface 191b of the first printed circuit board 101. The heights of the connectors 11a to 11c are all represented by h2. The connectors 11j to 11l are mounted on the rear surface 192c of the second printed circuit board 102. The heights of the connectors 11j to 11l are all represented by h1. The height of the connector 11k is represented by h3. The connectors 11g to 11i are mounted on the rear surface 192b of the first printed circuit board 101. The connectors 11d to 11f are mounted on the front surface 191c of the second printed circuit board 102. The heights of the connectors 11d to 11f are all represented by h2. The connectors 11j to 11l are mounted on the rear surface 192c of the second printed circuit board 102. The heights of the connectors 11g and 11i are both represented by h1. The height of the connector 11h is represented by h3. Here, h3<h2<h1 holds true.

The distance from the connector 11a to the separation line 103a, the distance from the connector 11c to the separation line 103a, the distance from the connector 11d to the line 103b, and the distance from the connector 11f to the separation line 103b are all represented by L. The distance from the connector 11b to the separation line 103a and the distance from the connector 11e to the separation line 103b are both represented by S. The distance from the connector 11j to the separation line 103a, the distance from the connector 11k to the separation line 103a, and the distance from the connector 11l to the separation line 103a are all represented by S. The distance from the connector 11g to the separation line 103b, the distance from the connector 11h to the separation line 103b, and the distance from the connector 11i to the separation line 103b are both represented by S.

FIG. 4A is a C-C cross-sectional view illustrating the separation of the printed circuit boards produced through reversible imposition. FIG. 4B is a D-D cross-sectional view illustrating the separation of the printed circuit boards produced through reversible imposition. The cut faces C-C and D-D are indicated in FIG. 3. Here, a cuttable angle φ is an angle at which the first printed circuit board 101 and the second printed circuit board 102 can be separated at the separation line 103, and is an angle formed by the normal direction of the first printed circuit board 101 and the normal direction of the second printed circuit board 102. θ represents an angle formed by the second printed circuit board 102 (the first printed circuit board 101) before bending and the second printed circuit board 102 (the first printed circuit board 101) after bending. Here, φ=2θ.

As illustrated in FIG. 4A, the height h2 of the connector 11c mounted on the front surface 191b of the first printed circuit board 101 is lower than the height h1 of the connector 11l mounted on the rear surface 192c of the second printed circuit board 102. The distance L from the shorter connector 11c to the separation line 103b is set to a desired value. At this time, the distance S from the taller connector 11l to the separation line 103b is set to satisfy the following equation.

$$S \geq h2 \times \cos(\pi/2 - \varphi) - L \times \cos(\varphi) \tag{1}$$

If, for example, h1=8 mm, h2=5 mm, L=4 mm, and θ=30 deg, then S may be 2.3 mm or greater.

As illustrated in FIG. 4B, the height h3 of the connector 11k soldered to the rear surface 192c of the second printed circuit board 102 is lower than the height h2 of the connector 11b soldered to the front surface 191b of the first printed circuit board 101. The distance S pertaining to the shorter connector 11k is set to a desired value. At this time, a distance R pertaining to the taller connector 11b is set to satisfy the following equation.

$$R \geq h3 \times \cos(\pi/2 - \varphi) - S \times \cos(\varphi) \tag{2}$$

If, for example, h2=5 mm, h3=3 mm, S=2 mm, and θ=30 deg, then R may be 1.59 mm or greater.

Thus, according to the second embodiment, the first printed circuit board 101 and the second printed circuit board 102 can be separated from each other even when the connectors provided on the first printed circuit board 101 and the connectors provided on the second printed circuit board 102 are arranged on opposite sides of the separation line 103. In other words, the connectors provided on the first printed circuit board 101 and the connectors provided on the second printed circuit board 102 are arranged so that the circuit board sheet 100 breaks before those connectors can make contact with each other. Compared to the first embodiment, the second embodiment does not require the non-mounting regions 12, which makes it possible to reduce the size of the printed circuit boards.

Third Embodiment

In the second embodiment, the cable insertion direction of the connectors 11g to 11l is what is called the vertical direction. Such connectors may be called a "vertical type". In the third embodiment, the cable insertion direction of the connectors 11g to 11l is changed what is called the horizontal direction. Note that "horizontal" means being parallel to the front surface 191a and the rear surface 192a of the circuit board sheet 100. Such connectors may be called a "horizontal type". Note that the "vertical direction" is the direction parallel to the normal direction of the first printed circuit board 101 and the second printed circuit board 102. The "horizontal direction" is the direction orthogonal to the normal direction of the first printed circuit board 101 and the second printed circuit board 102.

With the first printed circuit board 101 and the second printed circuit board 102 described in the first and second embodiments, vertical type connectors 11a to 11l are provided on the front surfaces 191 and the rear surfaces 192. The process of fixing the printed circuit board to the electronic device and attaching cables to the connectors 11a to 11l tends to be complicated. This is because the front surface 191 or the rear surface 192 will always be facing the electronic device, which means there is not enough space to carry out the cable attachment work.

Figure 5:
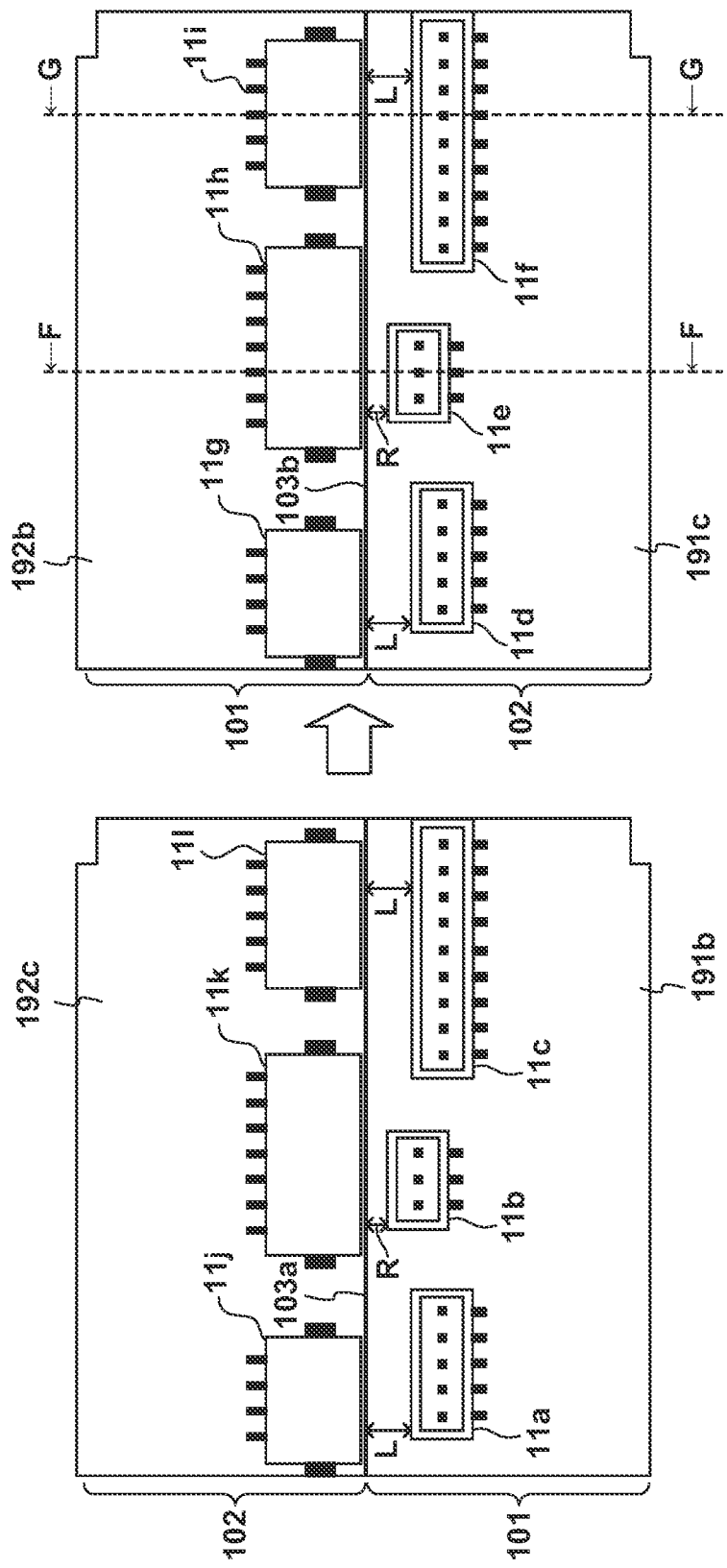
FIG. 5 is a diagram illustrating reversible imposition according to a third embodiment.

FIG. 5 is a diagram illustrating reversible imposition. Compared to FIG. 3, in FIG. 5, the cable insertion direction of the connectors 11g to 11l has been changed from the vertical direction to the horizontal direction. The distance from the insertion openings of the connectors 11g to 11l to the separation line 103 is substantially zero. In other words, the insertion faces of the insertion openings of the connectors 11g to 11l are substantially flush with the cut faces of the first printed circuit board 101 and the second printed circuit board 102. The heights of the connectors 11g, 11i, 11j, and 11l are all represented by h4. The heights of the connectors 11h and 11k are represented by h5. Here, h5<h4<h2 holds true.

FIG. 6A is an F-F cross-sectional view illustrating the separation of the printed circuit boards produced through reversible imposition. FIG. 6B is a G-G cross-sectional view illustrating the separation of the printed circuit boards produced through reversible imposition. The cut faces F-F and G-G are indicated in FIG. 5.

As illustrated in FIG. 6A, the connector 11e is taller than the connector 11h. The connector 11b is taller than the connector 11k. The distance R from the taller connectors 11e and 11b to the separation line 103 is set to satisfy the following equation.

$$R \geq h5 \times \cos(\pi/2 - \varphi) \quad (3)$$

If, for example, h5=2 mm and θ=30 deg, then R may be 1.73 mm or greater.

As illustrated in FIG. 6B, the connector 11f is taller than the connector 11i. The connector 11c is taller than the connector 11l. The distance L from the taller connectors 11c and 11f to the separation line 103 is set to satisfy the following equation.

$$L \geq h4 \times \cos(\pi/2 - 2\theta) \quad (4)$$

If, for example, h5=1 mm and θ=30 deg, then L may be 0.86 mm or greater.

In this manner, arranging the vertical type connectors to satisfy the above-described conditions makes it possible to easily separate the first printed circuit board 101 from the second printed circuit board 102, even when horizontal type connectors are employed. The process of attaching the cables is also improved by fixing the rear surface 192, to which the horizontal type connectors are fixed, so as to oppose the electronic device.

Figure 7:
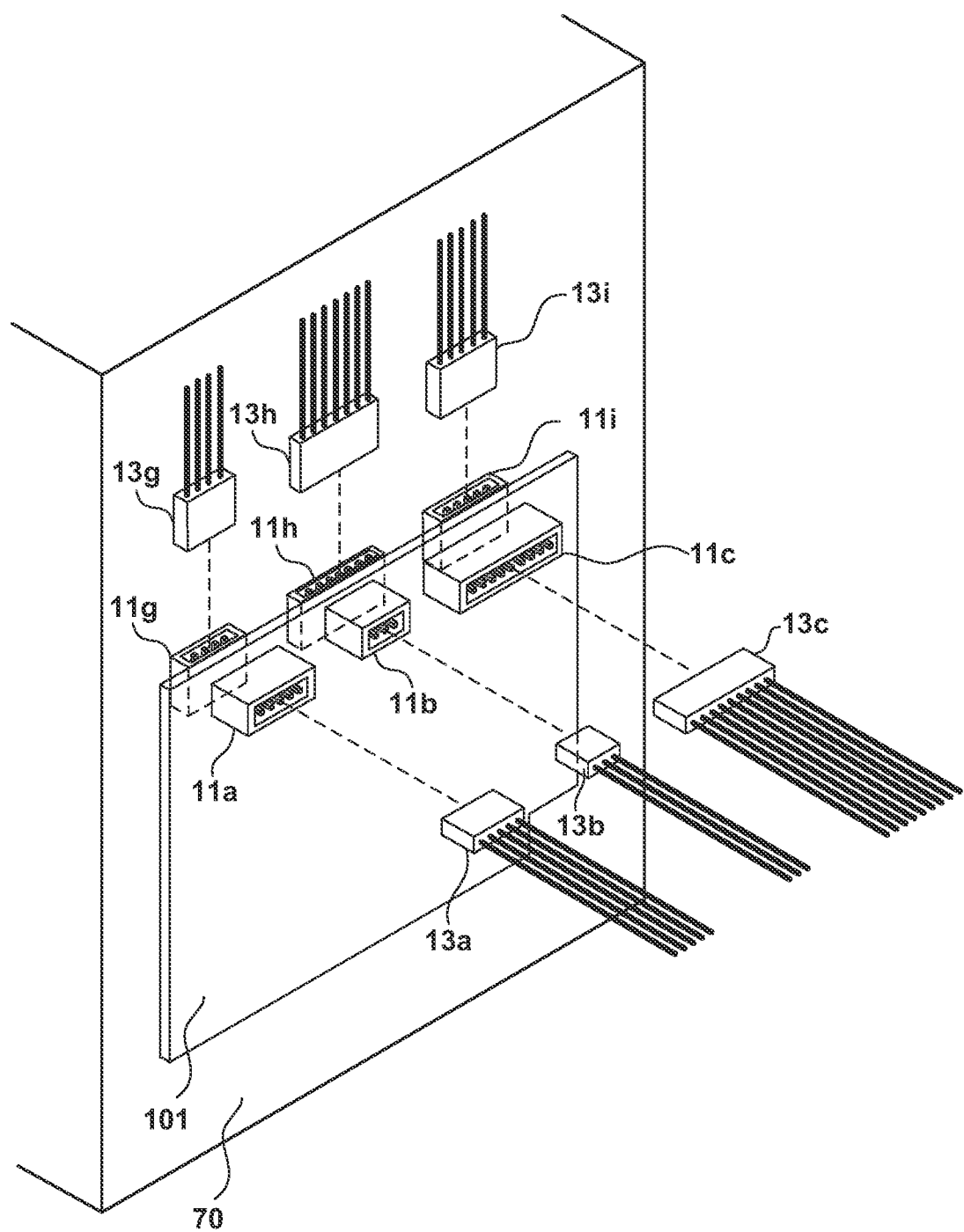
FIG. 7 is a diagram illustrating the attachment of cables to a printed circuit board.

FIG. 7 is a diagram illustrating the process of attaching the cables. An electronic device 70 is an image forming apparatus or the like. The first printed circuit board 101 is fixed to the electronic device 70 so that the rear surface 192b faces the housing of the electronic device 70. Furthermore, cables 13a to 13c are attached to corresponding ones of the vertical type connectors 11a to 11c. The front surface 191b does not face the electronic device 70, and thus a worker can easily attach the cables 13a to 13c. Likewise, cables 13g to 13i are attached to corresponding ones of the horizontal type connectors 11g to 11i. The connectors 11g to 11i are horizontal type connectors, and thus the connectors 11g to 11i will not be covered by the housing of the electronic device. This makes it easy to attach the cables 13g to 13i to the connectors 11g to 11i. Note that the connectors 11a to 11c may also be replaced with horizontal type connectors.

COMPARATIVE EXAMPLE

Figure 8:
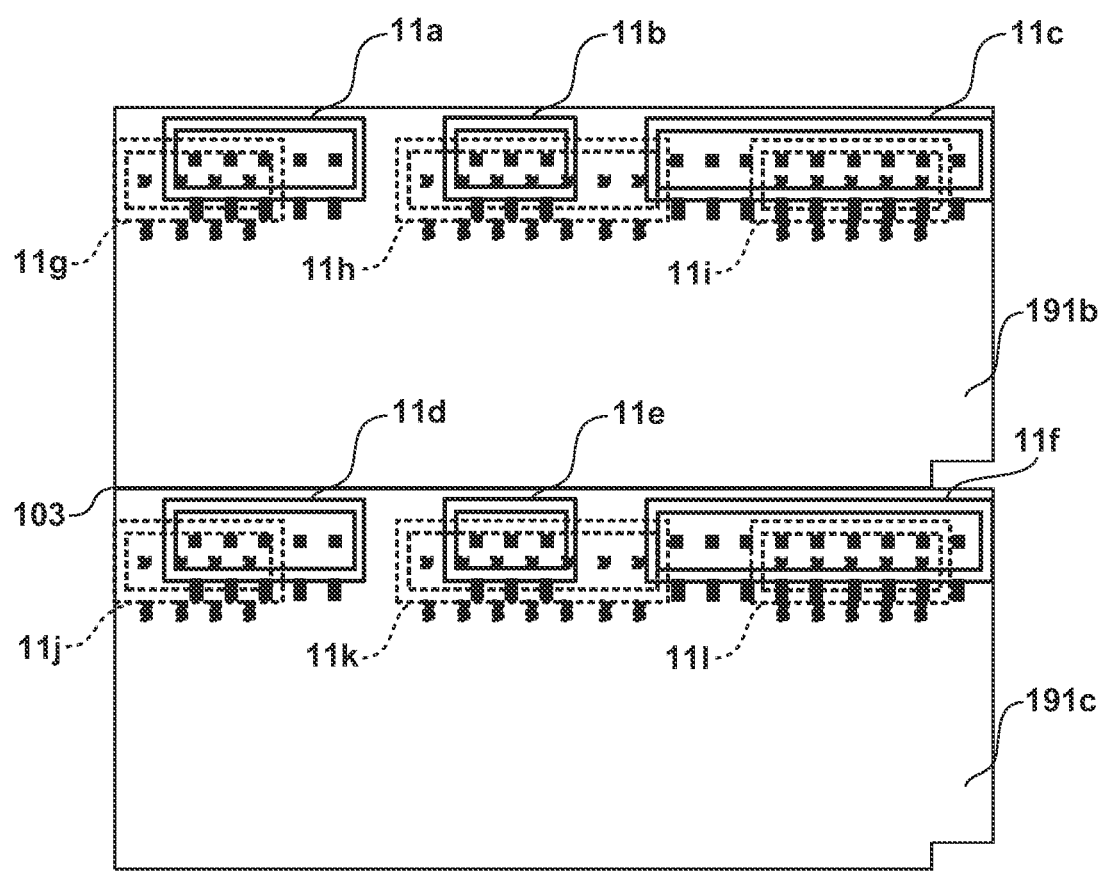
FIG. 8 is a diagram illustrating the arrangement of connectors according to a comparative example.

FIG. 8 is a diagram illustrating imposition according to a comparative example. In this example, the front surface 191b of the first printed circuit board 101 and the front surface 191c of the second printed circuit board 102 are formed on the front surface 191a of the circuit board sheet 100. Likewise, the rear surface 192b of the first printed circuit board 101 and the rear surface 192c of the second printed circuit board 102 are formed on the rear surface 192a of the circuit board sheet 100. In this case, the same metal mask cannot be used for both the front surface 191a of the circuit board sheet 100 and the rear surface 192a of the circuit board sheet 100. In other words, two metal masks are required.

Figure 9:
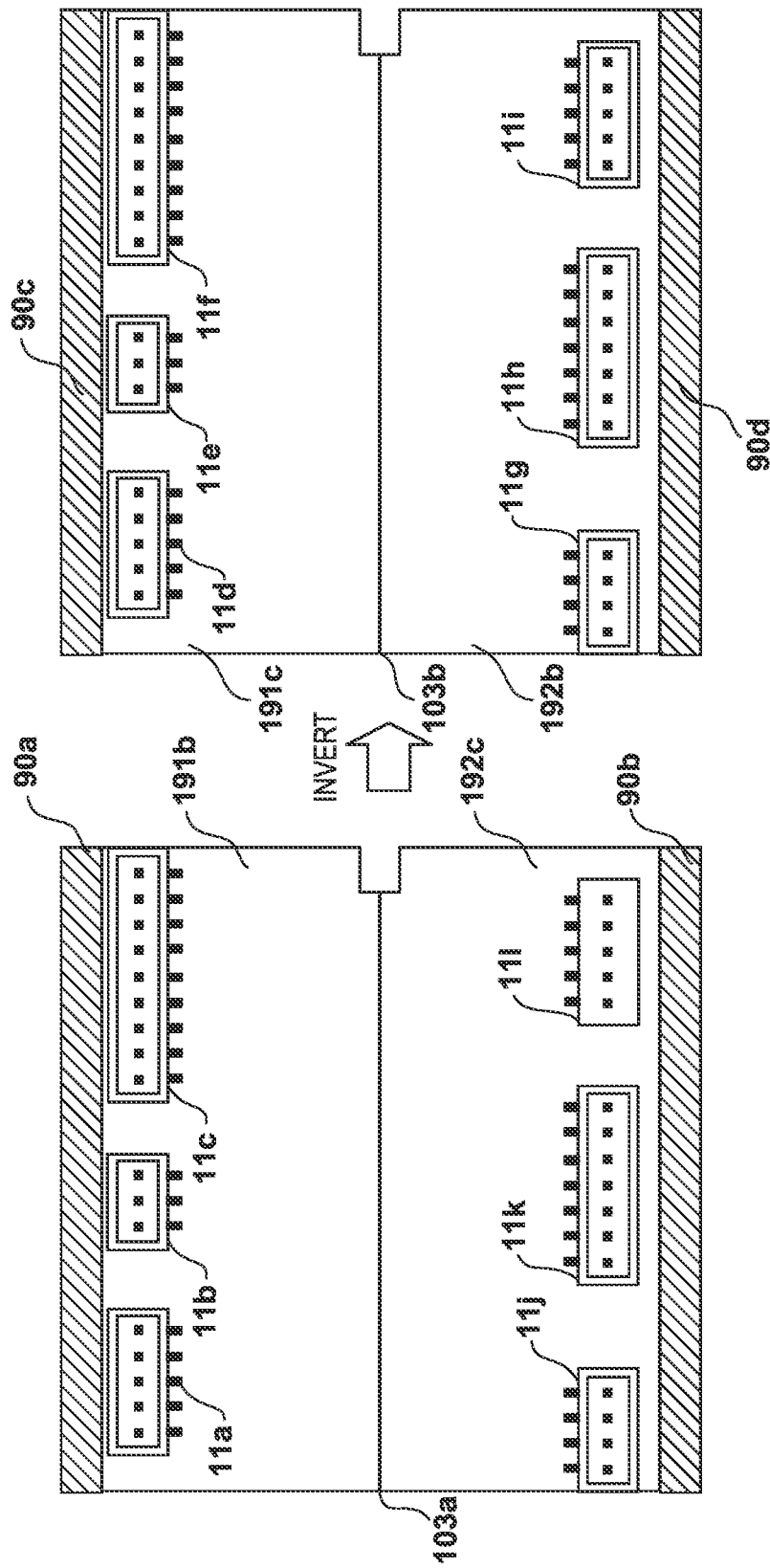
FIG. 9 is a diagram illustrating the arrangement of connectors according to a comparative example.

FIG. 9 is a diagram illustrating reversible imposition according to a comparative example. Reversible imposition provides an advantage in that the same metal mask cannot be used for both the front surface 191a of the circuit board sheet 100 and the rear surface 192a of the circuit board sheet 100. However, with the comparative example, the connectors 11a to 11l are disposed near the end parts of the circuit board sheet 100, in locations distanced from the separation line 103. As described above, rail holding regions 90a to 90d are provided near the end parts of the circuit board sheet 100. The connectors 11a to 11l cannot be disposed in the holding regions 90a to 90d. Additionally, the holding regions 90a to 90d are throwaway board, which reduces the effective usable area of the circuit board sheet 100. A process for cutting the holding regions 90a to 90d away is also necessary.

Figure 10:
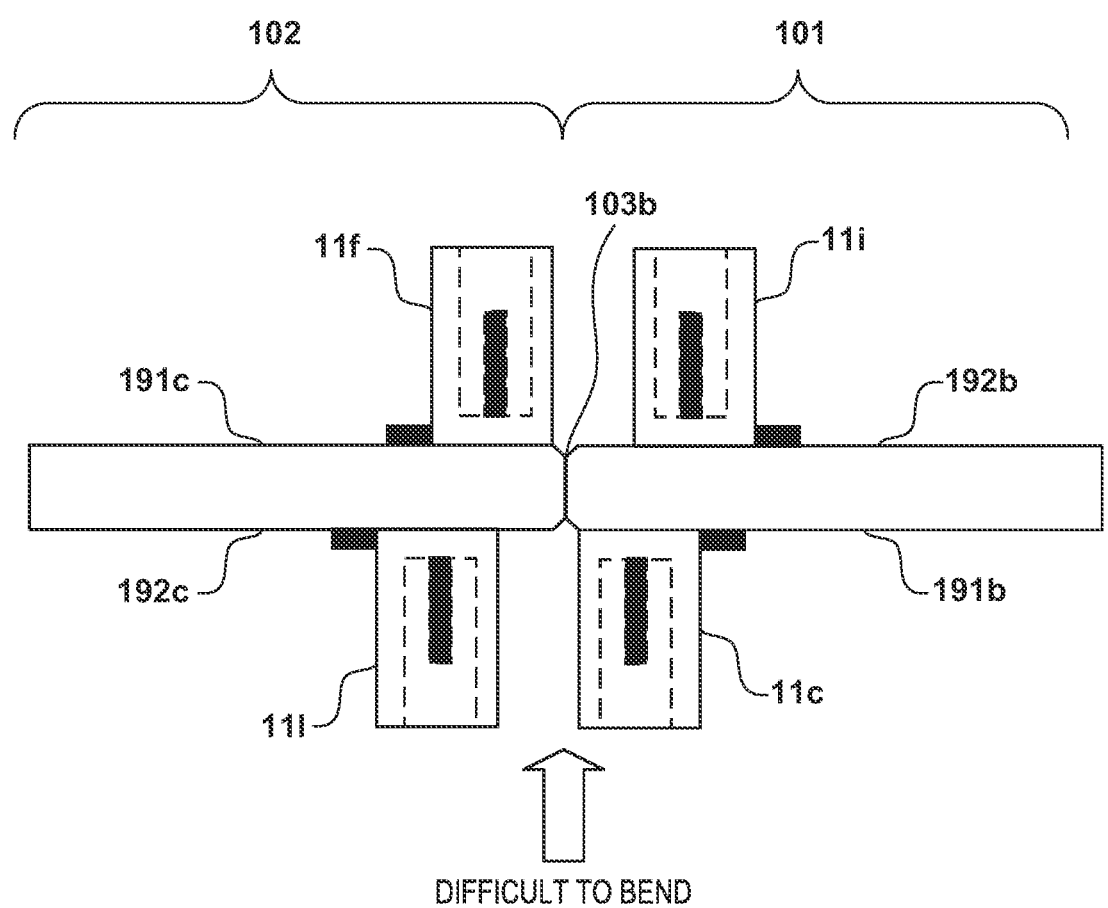
FIG. 10 is a cross-sectional view illustrating the separation of a printed circuit board according to a comparative example.

FIG. 10 is a cross-sectional view illustrating the reversible imposition according to the comparative example. In the comparative example, the connector 11c soldered to the front surface 191b of the first printed circuit board 101 is too close to the connector 11l soldered to the rear surface 192c of the second printed circuit board 102. Likewise, the connector 11i soldered to the rear surface 192b of the first printed circuit board 101 is too close to the connector 11f soldered to the front surface 191c of the second printed circuit board 102. As such, the first printed circuit board 101 and the second printed circuit board 102 cannot be separated from each other even if the circuit board sheet 100 is bent along the separation line 103. This is because the connector 11c and the connector 11l interfere with each other, or the connector 11f and the connector 11i interfere with each other, which makes it impossible to bend the circuit board sheet 100 to the cuttable angle φ.

However, according to the first to third embodiments, the circuit board sheet 100 can be bent to the cuttable angle φ. Additionally, according to the first to third embodiments, the connectors 11a to 11i are disposed near the separation line 103, and thus the holding regions 90a to 90d are not needed. Furthermore, according to the first to third embodiments, reversible imposition is employed, which makes it possible to use the same metal mask for both the front surface 191a of the circuit board sheet 100 and the rear surface 192a of the circuit board sheet 100.

Conclusion

Figure 11:
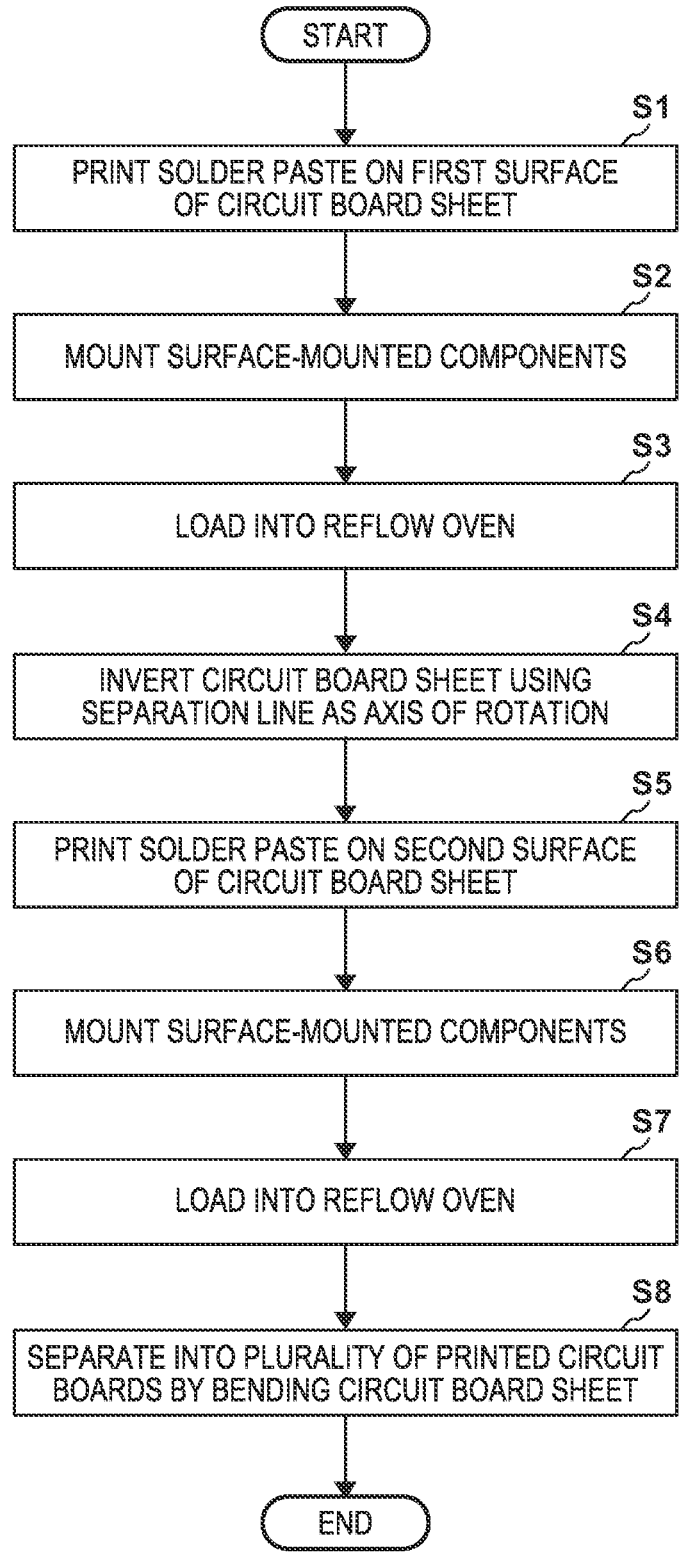
FIG. 11 is a flowchart illustrating reversible imposition.

FIG. 11 is a flowchart illustrating a method for manufacturing a plurality of printed circuit boards, each board having the same connector layout, by dividing the single circuit board sheet 100.

In step S1, a process of printing a solder paste on a first surface of the circuit board sheet 100 is carried out. The front surface 191a is an example of the first surface of the circuit board sheet 100. The solder paste is applied (printed) onto lands provided on the front surface 191a.

In step S2, a process of mounting one or more of the connectors 11 to each of a first surface of the first printed circuit board 101 and a second surface of the second printed circuit board 102, which are located on the first surface of the circuit board sheet 100, is carried out. A mounter mounts the connectors 11 and other surface-mounted components on the front surface 191a of the circuit board sheet 100. In particular, according to mounting data, the mounter aligns the terminals of the surface-mounted components with the lands on which the solder paste has been applied, and mounts the surface-mounted components to the front surface 191a. As illustrated in FIG. 1 and the like, among the plurality of printed circuit boards, the first surface of the first printed circuit board 101 (e.g., the front surface 191b ) and the second surface of the second printed circuit board 102 (e.g., the rear surface 192c) are arranged on either side of the separation line 103a.

In step S3, a process of melting the solder paste printed onto the first surface of the circuit board sheet 100 by loading the circuit board sheet 100 into a reflow oven is carried out.

In step S4, a process of inverting the circuit board sheet 100 that has been removed from the reflow oven, using the separation line 103 as the axis of rotation, is carried out.

In step S5, a process of printing a solder paste on a second surface of the circuit board sheet 100 is carried out. The rear surface 192a is an example of the second surface of the circuit board sheet 100. The metal mask for the front surface 191a is used again as the metal mask for the rear surface 192a.

In step S6, a process of mounting one or more of connectors to each of a second surface of the first printed circuit board 101 and a first surface of the second printed circuit board 102, which are located on the second surface of the circuit board sheet 100, is carried out. The mounting data used by the mounter for the second surface of the circuit board sheet 100 is the same as the mounting data used for the first surface of the circuit board sheet 100.

In step S7, a process of melting the solder paste printed onto the second surface of the circuit board sheet 100 by loading the circuit board sheet 100 into a reflow oven is carried out.

In step S8, a process of separating the circuit board sheet 100 into a plurality of printed circuit boards (e.g., the first printed circuit board 101 and the second printed circuit board 102) by bending the circuit board sheet 100 along the separation line 103 is carried out.

As illustrated in FIGS. 1 to 6, the first connector is soldered to the first surface of the first printed circuit board 101, and the second connector is soldered to the second surface of the second printed circuit board 102. Here, the first connector and the second connector are disposed in locations that enable the circuit board sheet 100 to be bent and broken (cut) along the separation line 103. In other words, the first connector and the second connector are disposed in locations that do not interfere with the bending of the circuit board sheet 100.

As illustrated in FIG. 2A, a first region (e.g., the mounting region 19c) may be provided on the first surface of the first printed circuit board 101, and a second region (e.g., the non-mounting region 12c ) may be provided on the second surface of the second printed circuit board 102. The first region and the second region are arranged so as to be line-symmetrical relative to the separation line 103. The first connector (e.g., the connector 11c) is soldered to the first region. No connector is mounted in the second region. As such, no interference arises between the connectors, and the circuit board sheet 100 can be bent to an extent that allows the sheet to be separated into a plurality of printed circuit boards.

As illustrated in FIG. 2A, a third region may be provided on the second surface (e.g., the rear surface 192b) located on the side of the first printed circuit board 101 opposite from the first surface. A fourth region may be provided on the first surface (e.g., the front surface 191c) located on the side of the second printed circuit board 102 opposite from the second surface. The third region and the fourth region are arranged so as to be line-symmetrical relative to the separation line 103. A third connector (e.g., the connector 11f) of the same type as the first connector is soldered to the fourth region. No connector is mounted in the third region (e.g., the non-mounting region 12f). In this manner, reversible imposition may be employed as the imposition.

As illustrated in FIG. 2B, a fifth region may be provided on the first surface of the first printed circuit board 101. A sixth region may be provided on the second surface of the second printed circuit board 102. The fifth region and the sixth region are arranged so as to be line-symmetrical relative to the separation line 103. No connector is mounted in the fifth region (e.g., the non-mounting region 12i ). The second connector (e.g., the connector 11i) is soldered to the sixth region.

As illustrated in FIG. 2B, a seventh region located on the side opposite from the fifth region may be provided. The seventh region is a region provided on the second surface located on the side of the first printed circuit board 101 opposite from the first surface. An eighth region (e.g., the non-mounting region 12l) located on the side opposite from the sixth region may be provided. The eighth region is a region provided on the first surface located on the side of the second printed circuit board 102 opposite from the second surface. The seventh region and the eighth region are arranged so as to be line-symmetrical relative to the separation line 103. A fourth connector (e.g., the connector 11l) of the same type as the second connector is soldered to the seventh region. No connector is mounted in the eighth region. As such, no interference arises between the connectors, even if the circuit board sheet 100 is subjected to a valley fold along the separation line.

As illustrated in FIG. 4A and the like, a first region may be provided on the first surface of the first printed circuit board 101, and a second region may be provided on the second surface of the second printed circuit board 102. The first region and the second region are arranged on respective sides of the separation line 103. The first connector (e.g., the connector 11c) is disposed in the first region, and the second connector (e.g., the connector 11l) is disposed in the second region. The circuit board sheet 100 is bent along the separation line 103 in the process of separating the first printed circuit board 101 from the second printed circuit board 102. When the circuit board sheet 100 is bent, it seems that the first connector and the second connector will make contact with each other. However, in reality, the first connector and the second connector are disposed so that the circuit board sheet 100 breaks before the first connector and the second connector make contact with each other.

There is an angle α at which the first connector and the second connector will make contact with each other when the circuit board sheet 100 is bent along the separation line 103. This angle α may be defined as an angle formed by the normal direction of the first surface of the first printed circuit board 101 and the normal direction of the second surface of the second printed circuit board 102. In other words, the angle α is the bend angle of the circuit board sheet 100 along the separation line 103. If the angle at which the circuit board sheet 100 breaks when the circuit board sheet 100 is bent along the separation line 103 (the cuttable angle φ) is lower than the angle α, the circuit board sheet 100 will break before the first connector and the second connector make contact with each other. Accordingly, the mounting position of the first connector, the mounting position of the second connector, and the height of the first connector are designed so that the cuttable angle φ is lower than the angle α. Furthermore, the height h2 of the first connector is set to be lower than the height h1 of the second connector.

The distance S from the second connector to the separation line 103, the distance L from the first connector to the separation line 103, the height h2 of the first connector, and the cuttable angle φ at which the circuit board sheet 100 breaks may satisfy equation (1).

As illustrated in FIG. 4A, a third region is located on the side opposite from the first region. The third region is a region provided on the second surface located on the side of the first printed circuit board 101 opposite from the first surface. The fourth region is located on the side opposite from the second region. The fourth region is a region provided on the first surface located on the side of the second printed circuit board 102 opposite from the second surface. The third region and the fourth region are arranged on respective sides of the separation line 103. A third connector (e.g., the connector 11i) of the same type as the second connector may be soldered to the third region. A fourth connector (e.g., the connector 11f) of the same type as the first connector may be soldered to the fourth region. In this manner, the imposition may be reversible imposition.

The angle at which the third connector and the fourth connector will make contact with each other when the circuit board sheet 100 is bent along the separation line 103 is the angle α. The mounting position of the third connector, the mounting position of the fourth connector, and the height of the fourth connector are designed so that the angle at which the circuit board sheet 100 breaks when the circuit board sheet 100 is bent along the separation line 103 (e.g., φ) is lower than the angle α. Furthermore, the height h2 of the fourth connector is set to be lower than the height h1 of the third connector.

The distance S from the third connector to the separation line 103, the distance L from the fourth connector to the separation line 103, the height h2 of the fourth connector, and the angle φ at which the circuit board sheet 100 breaks may satisfy equation (1).

As illustrated in FIG. 4B, a fifth region may be provided on the first surface of the first printed circuit board 101, and a sixth region may be provided on the second surface of the second printed circuit board 102. The fifth region and the sixth region are arranged on respective sides of the separation line 103. A fifth connector (e.g., the connector 11b) is soldered to the fifth region, and a sixth connector (e.g., the connector 11k) is soldered to the sixth region. The seventh region is located on the side opposite from the fifth region. The seventh region is a region provided on the second surface located on the side of the first printed circuit board 101 opposite from the first surface. The eighth region is located on the side opposite from the sixth region. The eighth region is a region provided on the first surface located on the side of the second printed circuit board 102 opposite from the second surface. The seventh region and the eighth region are arranged on respective sides of the separation line 103. A seventh connector (e.g., the connector 11h) of the same type as the sixth connector is soldered to the seventh region, and an eighth connector (e.g., the connector 11e) of the same type as the fifth connector is soldered to the eighth region.

The angle at which the fifth connector and the sixth connector will make contact with each other when the circuit board sheet 100 is bent along the separation line 103 may be defined as β. The angle β is an angle formed by the second surface of the first printed circuit board 101 and the first surface of the second printed circuit board 102. It is important for the angle at which the circuit board sheet 100 breaks when the circuit board sheet 100 is bent along the separation line 103 (e.g., the cuttable angle φ) to be lower than the angle β. The mounting position of the fifth connector, the mounting position of the sixth connector, and the height of the sixth connector are designed so as to satisfy that condition. Additionally, the height h3 of the sixth connector is set to be lower than the height h2 of the fifth connector. The distance R from the fifth connector to the separation line 103, the distance S from the sixth connector to the separation line 103, the height h3 of the sixth connector, and the angle φ at which the circuit board sheet 100 breaks satisfy equation (2).

The angle at which the seventh connector and the eighth connector will make contact with each other when the circuit board sheet 100 is bent along the separation line 103 may be defined as β. The mounting position of the seventh connector, the mounting position of the eighth connector, and the height of the seventh connector are designed so that the cuttable angle φ is lower than the angle β. Additionally, the height h3 of the seventh connector is set to be lower than the height h2 of the eighth connector. The distance R from the eighth connector to the separation line 103, the distance S from the seventh connector to the separation line 103, the height h3 of the seventh connector, and the angle φ at which the circuit board sheet 100 breaks satisfy equation (2).

As illustrated in FIGS. 5, 6 and the like, the direction in which a cable is connected to the first connector (e.g., the connector 11b) may be parallel to the normal direction of the first surface of the first printed circuit board 101. The direction in which a cable is connected to the second connector (e.g., the connector 11k) may be orthogonal to the normal direction of the second surface of the second printed circuit board 102. Additionally, a cable connection opening of the second connector may face a side surface of the first connector. As illustrated in FIG. 6A, the insertion opening of the second connector is arranged so as to be substantially flush with the end part of the first printed circuit board.

The angle at which the first connector and the second connector will make contact with each other when the circuit board sheet 100 is bent along the separation line 103 (the angle formed by the normal direction of the first surface of the first printed circuit board 101 and the normal direction of the second surface of the second printed circuit board 102) is $\alpha$. It is important for the angle at which the circuit board sheet 100 breaks when the circuit board sheet 100 is bent along the separation line 103 (the cuttable angle $\varphi$) to be lower than the angle $\alpha$. The mounting position of the first connector, the mounting position of the second connector, and the height h2 of the first connector are designed so as to satisfy that condition. Furthermore, the height h5 of the second connector is set to be lower than the height h2 of the first connector. The distance R from the first connector to the separation line 103, the height h5 of the second connector, and the angle $\varphi$ at which the circuit board sheet 100 breaks satisfy equation (3).

As illustrated in FIG. 6A, there is a third region located on the side opposite from the first region, the third region being provided on the second surface located on the side of the first printed circuit board 101 opposite from the first surface. A third connector (e.g., the connector 11h) of the same type as the second connector is soldered to the third region. There is a fourth region located on the side opposite from the second region, the fourth region being provided on the first surface located on the side of the second printed circuit board 102 opposite from the second surface. A fourth connector (e.g., the connector 11e) of the same type as the first connector is soldered to the fourth region. Here, the third region and the fourth region are arranged on respective sides of the separation line 103. The distance R from the fourth connector to the separation line 103, the height h5 of the third connector, and the angle $\varphi$ at which the circuit board sheet 100 breaks satisfy equation (3).

As illustrated in FIG. 6B, a fifth region is provided on the first surface of the first printed circuit board 101. The fifth connector (e.g., the connector 11c) is soldered to the fifth region. A sixth region is provided on the second surface of the second printed circuit board 102. The sixth connector (e.g., the connector 11l) is soldered to the sixth region. The fifth region and the sixth region are arranged on respective sides of the separation line 103. The seventh region is a region located on the side opposite from the fifth region. The seventh region is a region provided on the second surface located on the side of the first printed circuit board 101 opposite from the first surface. A seventh connector (e.g., the connector 11i) of the same type as the sixth connector is soldered to the seventh region. The eighth region is a region located on the side opposite from the sixth region. The eighth region is a region provided on the first surface located on the side of the second printed circuit board 102 opposite from the second surface. An eighth connector (e.g., the connector 11o) of the same type as the fifth connector is soldered to the eighth region. The seventh region and the eighth region are arranged on respective sides of the separation line 103. A direction in which a cable is connected to the fifth connector is parallel to the normal direction of the first surface of the first printed circuit board 101. A direction in which a cable is connected to the seventh connector is orthogonal to the normal direction of the second surface of the first printed circuit board 101. Additionally, a cable connection opening of the seventh connector faces a side surface of the eighth connector. A direction in which a cable is connected to the sixth connector is orthogonal to the normal direction of the second surface of the second printed circuit board 102. A cable connection opening of the sixth connector faces a side surface of the fifth connector. A direction in which a cable is connected to the eighth connector is parallel to the normal direction of the first surface of the second printed circuit board 102.

As illustrated in FIG. 6B, the distance L from the fifth connector to the separation line 103, the height h4 of the sixth connector, and the angle $\varphi$ at which the circuit board sheet 100 breaks satisfy equation (4). As such, the circuit board sheet 100 breaks before the sixth connector and the fifth connector make contact with each other. The distance L from the eighth connector to the separation line 103, the height h4 of the seventh connector, and the angle $\varphi$ at which the circuit board sheet 100 breaks satisfy equation (4). As such, the circuit board sheet 100 breaks before the eighth connector and the seventh connector make contact with each other.

As illustrated in FIGS. 1, 3, and 5, a non-mounting region, where connectors are not disposed, may be provided at both end parts of the circuit board sheet 100 parallel to the separation line 103. As described using FIG. 9, the non-mounting regions at both of the end parts are held by rails while in the reflow oven. In other words, according to this embodiment, a rail holding region can also be secured.

As illustrated in FIG. 1, according to this embodiment, the circuit board sheet 100, which includes a plurality of printed circuit boards, each having the same connector layout, is provided. The circuit board sheet 100 includes the first printed circuit board 101, and a second printed circuit board 102 having the same connector layout as the connector layout on the first printed circuit board 101. The separation line 103 is a line serving as a reference when separating the first printed circuit board 101 from the second printed circuit board 102 by bending and breaking the circuit board sheet 100. The circuit board sheet 100 further includes a first connector soldered to the first surface of the first printed circuit board 101 and a second connector soldered to the second surface of the second printed circuit board 102. The first connector and the second connector are disposed in locations that enable the circuit board sheet 100 to be bent and broken along the separation line 103.

According to the first embodiment, the first region provided on the first surface of the first printed circuit board 101 and the second region provided on the second surface of the second printed circuit board 102 are arranged so as to be line symmetrical relative to the separation line 103. The first connector is soldered to the first region, and no connector is mounted in the second region.

According to the second embodiment, the first region provided on the first surface of the first printed circuit board 101 and the second region provided on the second surface of the second printed circuit board 102 are arranged on respective sides of the separation line 103. The first connector is disposed in the first region, and the second connector is disposed in the second region. The circuit board sheet 100 is bent along the separation line 103 in the process of separating the first printed circuit board 101 from the second printed circuit board 102. The first connector and the second connector are disposed so that the circuit board sheet 100 breaks before the first connector and the second connector can make contact with each other.

According to the third embodiment, a direction in which a cable is connected to the first connector is parallel to the normal direction of the first surface of the first printed circuit board 101. A direction in which a cable is connected to the second connector is orthogonal to the normal direction of the second surface of the second printed circuit board 102. A cable connection opening of the second connector faces a side surface of the first connector.

Figure 12:
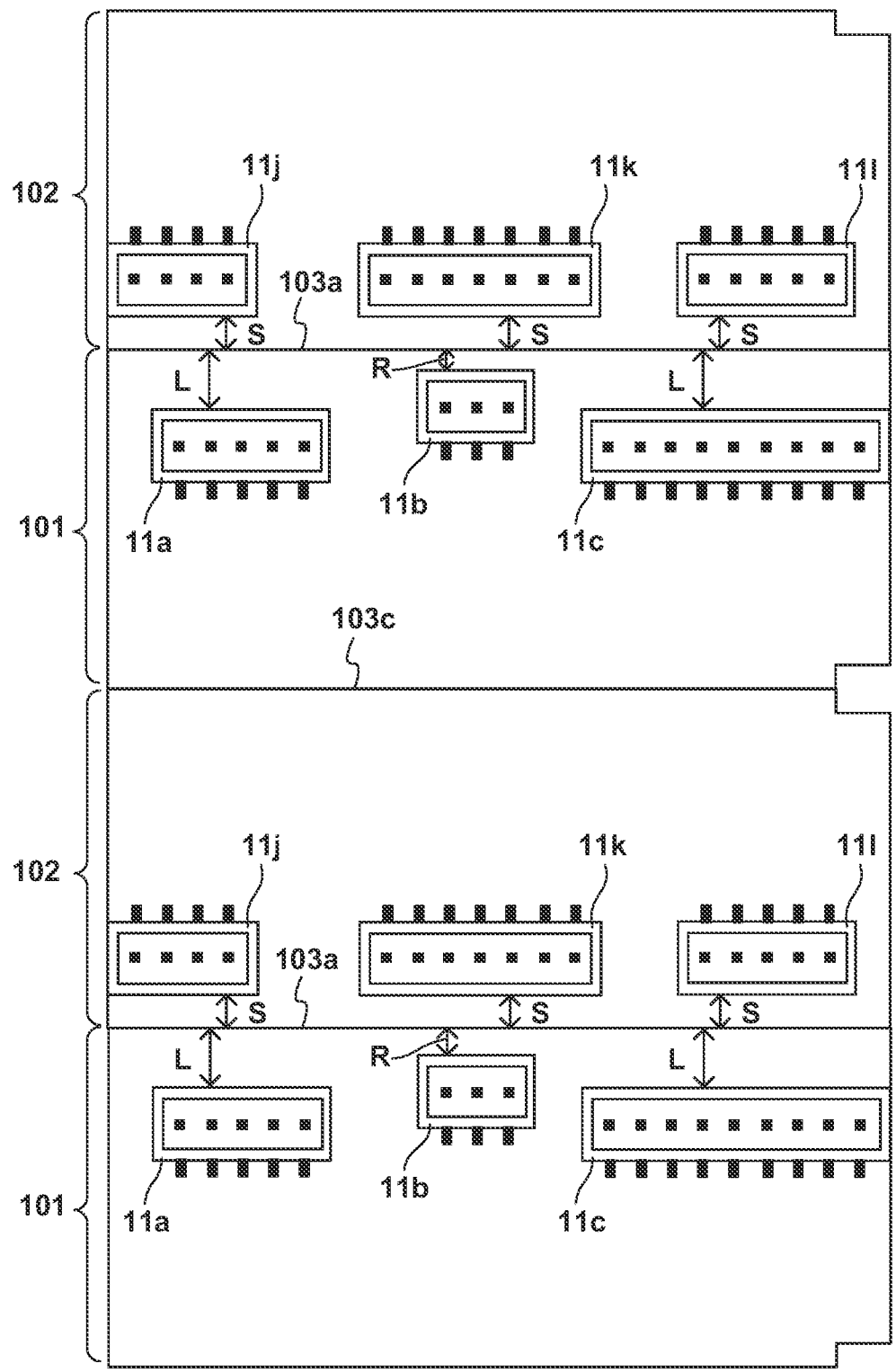
FIG. 12 is a diagram illustrating reversible imposition for manufacturing four or more printed circuit boards.

According to the first to third embodiments, two printed circuit boards are formed from the circuit board sheet 100. However, the present invention can also be used in cases where an even number of four or more printed circuit boards are manufactured from the circuit board sheet 100. FIG. 12 illustrates a method for manufacturing four printed circuit boards from the circuit board sheet 100. In this example, a pair of boards constituted by the above-described first printed circuit board 101 and second printed circuit board 102 are provided, and another pair of boards is formed on the opposite side relative to the separation line 103c. Four printed circuit boards can be manufactured by bending the circuit board sheet 100 along the three separation lines 103 illustrated in FIG. 12. Any of the first to third embodiments may be applied in the first printed circuit board 101 and the second printed circuit board 102 in each pair of boards.

Image Forming Apparatus

Figure 13:
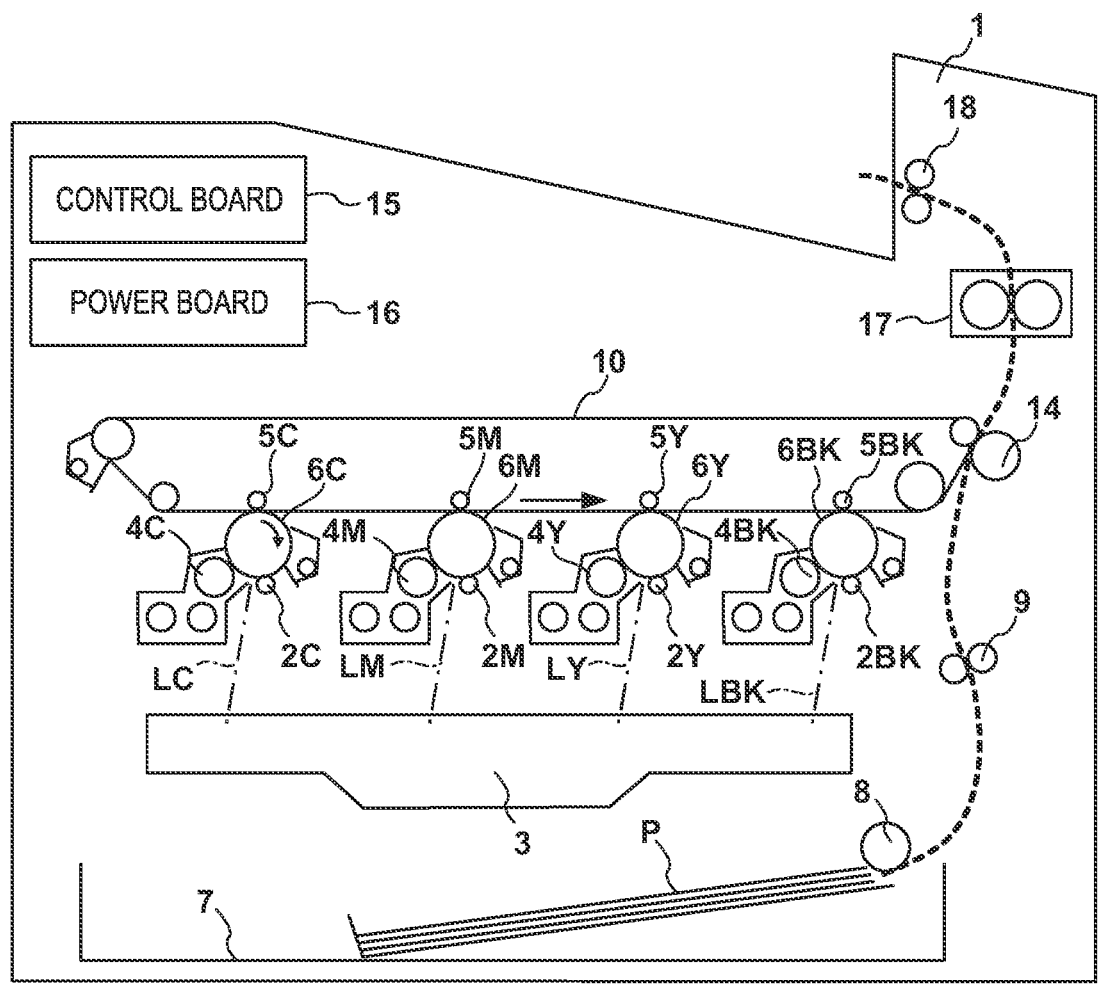
FIG. 13 is a diagram illustrating an example of an electronic device.

FIG. 13 illustrates an intermediate transfer-type image forming apparatus 1. The image forming apparatus 1 may be an image forming apparatus that forms a monochromatic image. However, here, the image forming apparatus 1 is an electrophotographic image forming apparatus that forms a color image by combining a plurality of colorants. The image forming apparatus 1 uses four colors of developers, namely yellow (Y), magenta (M), cyan (C), and black (BK). Although letters indicating the colors are appended to the reference signs in FIG. 13, those letters will be omitted when describing items common for all four colors.

Photosensitive drums 6C, 6M, 6Y, and 6BK are image carriers which are disposed at equal intervals and which hold electrostatic latent images, toner images, and the like. A controller of a control board 15 controls a power board 16 to generate a charging voltage, which is supplied to primary chargers 2. The primary chargers 2 are an example of charging unit for uniformly charging the image carriers. The primary chargers 2 use the charging voltage to uniformly charge the surface of the photosensitive drums 6. A scanning optical unit 3 is an example of scanning unit for forming an electrostatic latent image by scanning the surface of the image carrier with a laser beam. The scanning optical unit 3 emits light beams (laser beams) L, which have been modulated on the basis of an input image, toward the photosensitive drums 6. The light beams (laser beams) L form electrostatic latent images on the surfaces of the photosensitive drums 6. The controller provided in the control board 15 controls the power board 16 to generate a developing voltage, which is supplied to developers 4. The developers 4 are an example of developing unit for forming a toner image by causing toner to adhere so as to develop the electrostatic latent image. The developers 4 cause cyan, magenta, yellow, and black developers to adhere to the electrostatic latent images through sleeves, blades, and the like to which the developing voltage has been applied. As a result, the electrostatic latent images are developed, and developer images (toner images) are formed.

A feed roller 8 feeds sheets P, which are held in a paper feed tray 7, one sheet at a time. Resist rollers 9 transport the sheet P to a secondary transfer unit in synchronization with the timing at which images are written.

The controller of the control board 15 controls the power board 16 to generate a primary transfer voltage, which is supplied to primary transfer rollers 5. The primary transfer rollers 5 transfer the toner images held on the photosensitive drums 6 to an intermediate transfer belt 10. The primary transfer voltage applied to the primary transfer rollers 5 instigates the transfer of the toner images onto the intermediate transfer belt 10. The intermediate transfer belt 10 functions as an intermediate transfer member. The secondary transfer unit includes a secondary transfer roller 14. The controller of the control board 15 controls the power board 16 to generate a secondary transfer voltage, which is supplied to the secondary transfer roller 14. At the secondary transfer unit, the intermediate transfer belt 10 and the secondary transfer roller 14 transport the sheet P while pinching the sheet P, which transfers the color toner image held on the intermediate transfer belt 10 onto the sheet P. The secondary transfer voltage instigates the transfer of the toner image onto the sheet P. The sheet P is then transported to a fixing unit 17. The fixing unit 17 fixes the toner image held on the sheet P using pressure and heat. Discharge rollers 18 discharge the sheet P on which the image has been formed. Note that the primary transfer rollers 5, the intermediate transfer belt 10, and the secondary transfer roller 14 are an example of transfer unit for transferring a toner image onto a sheet. The fixing unit 17 is an example of fixing unit for fixing the held toner image held onto the sheet P. The first printed circuit board 101, the second printed circuit board 102, and the like according to the first to third embodiments may be employed as the control board 15 or the power board 16.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-149677, filed Aug. 8, 2018 which is hereby incorporated by reference herein in its entirety.

What is claimed is:

1. A method for manufacturing a plurality of printed circuit boards, each board having the same connector layout, by dividing a single circuit board sheet, the method comprising:
    printing a solder paste on a first surface of the circuit board sheet;
    mounting one or more connectors on each of a first surface of a first printed circuit board and a second surface of a second printed circuit board which, of the plurality of printed circuit boards, are located on opposite sides of a separation line, the first surface of the first printed circuit board and the second surface of the second printed circuit board being located on the first surface of the circuit board sheet;
    melting the solder paste printed onto the first surface of the circuit board sheet by loading the circuit board sheet into a reflow oven;
    inverting the circuit board sheet that has been removed from the reflow oven;
    printing a solder paste on a second surface of the circuit board sheet;
    mounting one or more connectors to each of a second surface of the first printed circuit board and a first surface of the second printed circuit board located on the second surface of the circuit board sheet;
    melting the solder paste printed onto the second surface of the circuit board sheet by loading the circuit board sheet into the reflow oven; and
    separating the first printed circuit board from the second printed circuit board by bending and breaking the circuit board sheet along the separation line,
    wherein a first connector soldered to the first surface of the first printed circuit board and a second connector soldered to the second surface of the second printed circuit board are disposed at a location where the circuit board sheet can be bent and broken along the separation line.

2. The method according to claim 1, wherein
    a first region provided on the first surface of the first printed circuit board and a second region provided on the second surface of the second printed circuit board are arranged so as to be line-symmetrical relative to the separation line; and
    a first connector is soldered to the first region, and no connector is mounted in the second region.

3. The method according to claim 1, wherein
    a third region provided on the second surface located on the side of the first printed circuit board opposite from the first surface of the first printed circuit board, and a fourth region provided on the first surface located on the side of the second printed circuit board opposite from the second surface, are arranged so as to be line-symmetrical relative to the separation line; and
    a third connector of the same type as the first connector is soldered to the fourth region, and no connector is mounted in the third region.

4. The method according to claim 1, wherein
    a fifth region provided on the first surface of the first printed circuit board and a sixth region provided on the second surface of the second printed circuit board are arranged so as to be line-symmetrical relative to the separation line; and
    no connector is mounted in the fifth region, and the second connector is soldered to the sixth region.

5. The method according to claim 4, wherein
    a seventh region, which is located on the side opposite from the fifth region and which is provided on the second surface located on the side of the first printed circuit board opposite from the first surface, and an eighth region, which is located on the side opposite from the sixth region and which is provided on the first surface located on the side of the second printed circuit board opposite from the second surface, are arranged so as to be symmetrical relative to the separation line; and
    a fourth connector of the same type as the second connector is soldered to the seventh region, and no connector is mounted in the eighth region.

6. The method according to claim 1, wherein
    a first region provided on the first surface of the first printed circuit board and a second region provided on the second surface of the second printed circuit board are arranged on respective sides of the separation line;
    the first connector is disposed in the first region, and the second connector is disposed in the second region; and
    the first connector and the second connector are disposed so that in the step of separating the first printed circuit board from the second printed circuit board, the circuit board sheet breaks before the first connector and the second connector can make contact with each other when the circuit board sheet is bent along the separation line.

7. The method according to claim 6, wherein
    the mounting position of the first connector, the mounting position of the second connector, and the height of the first connector are designed, and the height of the first connector is set to be lower than the height of the second connector, so that an angle at which the circuit board sheet breaks when the circuit board sheet is bent along the separation line is smaller than an angle, formed by the normal direction of the first surface of the first printed circuit board and the normal direction of the second surface of the second printed circuit board, at which the first connector and the second connector will make contact when the circuit board sheet is bent along the separation line.

8. The method according to claim 7, wherein
    a distance S from the second connector to the separation line, a distance L from the first connector to the separation line, a height h2 of the first connector, and an angle $\varphi$ at which the circuit board sheet breaks, satisfy the following equation:

$$S \geq h2 \times \cos(\pi/2 - \varphi) - L \times \cos(\varphi).$$

9. The method according to claim 6, wherein
    a third region, which is located on the side opposite from the first region and which is provided on the second surface located on the side of the first printed circuit board opposite from the first surface, and a fourth region, which is located on the side opposite from the second region and which is provided on the first surface located on the side of the second printed circuit board opposite from the second surface, are arranged on respective side of the separation line; and a third connector of the same type as the second connector is soldered to the third region, and a fourth connector of the same type as the first connector is soldered to the fourth region.

10. The method according to claim 9, wherein
the mounting position of the third connector, the mounting position of the fourth connector, and the height of the fourth connector are designed, and the height of the fourth connector is set to be lower than the height of the third connector, so that an angle at which the circuit board sheet breaks when the circuit board sheet is bent along the separation line is smaller than an angle, formed by the normal direction of the second surface of the first printed circuit board and the normal direction of the first surface of the second printed circuit board, at which the third connector and the fourth connector will make contact when the circuit board sheet is bent along the separation line.

11. The method according to claim 10, wherein
a distance S from the third connector to the separation line, a distance L from the fourth connector to the separation line, a height h2 of the fourth connector, and an angle φ at which the circuit board sheet breaks, satisfy the following equation:

$$S \geq h2 \times \cos(\pi/2 - \varphi) - L \times \cos(\varphi).$$

12. The method according to claim 6, wherein
a fifth region provided on the first surface of the first printed circuit board and a sixth region provided on the second surface of the second printed circuit board are arranged on respective sides of the separation line;
a fifth connector is soldered to the fifth region, and a sixth connector is soldered to the sixth region;
a seventh region, which is located on the side opposite from the fifth region and which is provided on the second surface located on the side of the first printed circuit board opposite from the first surface, and an eighth region, which is located on the side opposite from the sixth region and which is provided on the first surface located on the side of the second printed circuit board opposite from the second surface, are arranged on respective sides of the separation line; and
a seventh connector of the same type as the sixth connector is soldered to the seventh region, and an eighth connector of the same type as the fifth connector is soldered to the eighth region.

13. The method according to claim 12, wherein
the mounting position of the fifth connector, the mounting position of the sixth connector, and the height of the sixth connector are designed, and the height of the sixth connector is set to be lower than the height of the fifth connector, so that an angle at which the circuit board sheet breaks when the circuit board sheet is bent along the separation line is smaller than an angle, formed by the normal direction of the second surface of the first printed circuit board and the normal direction of the first surface of the second printed circuit board, at which the fifth connector and the sixth connector will make contact when the circuit board sheet is bent along the separation line.

14. The method according to claim 13, wherein
a distance R from the fifth connector to the separation line, a distance S from the sixth connector to the separation line, a height h3 of the sixth connector, and an angle φ at which the circuit board sheet breaks, satisfy the following equation:

$$R \geq h3 \times \cos(\pi/2 - \varphi) - S \times \cos(\varphi).$$

15. The method according to claim 12, wherein
a distance R from the eighth connector to the separation line, a distance S from the seventh connector to the separation line, a height h3 of the seventh connector, and an angle φ at which the circuit board sheet breaks, satisfy the following equation:

$$R \geq h3 \times \cos(\pi/2 - \varphi) - S \times \cos(\varphi).$$

16. The method according to claim 6, wherein
a direction in which a cable is connected to the first connector is parallel to the normal direction of the first surface of the first printed circuit board;
a direction in which a cable is connected to the second connector is orthogonal to the normal direction of the second surface of the second printed circuit board; and
a cable connection opening of the second connector faces a side surface of the first connector.

17. The method according to claim 16, wherein
the mounting position of the first connector, the mounting position of the second connector, and the height of the first connector are designed, and the height of the second connector is set to be lower than the height of the first connector, so that an angle at which the circuit board sheet breaks when the circuit board sheet is bent along the separation line is smaller than an angle, formed by the normal direction of the first surface of the first printed circuit board and the normal direction of the second surface of the second printed circuit board, at which the first connector and the second connector will make contact when the circuit board sheet is bent along the separation line.

18. The method according to claim 17, wherein
a distance R from the first connector to the separation line, a height h5 of the second connector, and an angle φ at which the circuit board sheet breaks, satisfy the following equation:

$$R \geq h5 \times \cos(\pi/2 - \varphi).$$

19. The method according to claim 16, wherein
a third region, which is located on the side opposite from the first region and which is provided on the second surface located on the side of the first printed circuit board opposite from the first surface, and a fourth region, which is located on the side opposite from the second region and which is provided on the first surface located on the side of the second printed circuit board opposite from the second surface, are arranged on respective side of the separation line; and
a third connector of the same type as the second connector is soldered to the third region, and a fourth connector of the same type as the first connector is soldered to the fourth region.

20. The method according to claim 19, wherein
a distance R from the fourth connector to the separation line, a height h5 of the third connector, and an angle φ at which the circuit board sheet breaks, satisfy the following equation:

$$R \geq h5 \times \cos(\pi/2 - \varphi).$$

21. The method according to claim 16, wherein
a fifth region provided on the first surface of the first printed circuit board and a sixth region provided on the second surface of the second printed circuit board are arranged on respective sides of the separation line;
a fifth connector is soldered to the fifth region, and a sixth connector is soldered to the sixth region;

a seventh region, which is located on the side opposite from the fifth region and which is provided on the second surface located on the side of the first printed circuit board opposite from the first surface, and an eighth region, which is located on the side opposite from the sixth region and which is provided on the first surface located on the side of the second printed circuit board opposite from the second surface, are arranged on respective sides of the separation line;

a seventh connector of the same type as the sixth connector is soldered to the seventh region, and an eighth connector of the same type as the fifth connector is soldered to the eighth region;

a direction in which a cable is connected to the fifth connector is parallel to the normal direction of the first surface of the first printed circuit board;

a direction in which a cable is connected to the seventh connector is orthogonal to the normal direction of the second surface of the first printed circuit board, and a cable connection opening of the seventh connector faces a side surface of the eighth connector;

a direction in which a cable is connected to the sixth connector is orthogonal to the normal direction of the second surface of the second printed circuit board, and a cable connection opening of the sixth connector faces a side surface of the fifth connector; and a direction in which a cable is connected to the eighth connector is parallel to the normal direction of the first surface of the second printed circuit board.

22. The method according to claim 21, wherein
a distance L from the fifth connector to the separation line, a height $h4$ of the sixth connector, and an angle $\varphi$ at which the circuit board sheet breaks, satisfy the following equation:

$$L \geq h4 \times \cos(\pi/2 - \varphi).$$

23. The method according to claim 21, wherein
a distance L from the eighth connector to the separation line, a height $h4$ of the seventh connector, and an angle $\varphi$ at which the circuit board sheet breaks, satisfy the following equation:

$$L \geq h4 \times \cos(\pi/2 - \varphi).$$

24. The method according to claim 21, wherein
a non-mounting region where no connector is disposed is provided at both end parts of the circuit board sheet, the end parts being parallel to the separation line, and the non-mounting regions at both end parts are held by rails in the reflow oven.

25. A circuit board sheet including a plurality of printed circuit boards which have the same connector layout, the sheet comprising:
a first printed circuit board;
a second printed circuit board having the same connector layout as a connector layout on the first printed circuit board;
a separation line serving as a reference when separating the first printed circuit board from the second printed circuit board by bending and breaking the circuit board sheet;
a first connector soldered to a first surface of the first printed circuit board; and
a second connector soldered to a second surface of the second printed circuit board,
wherein the first connector and the second connector are arranged in locations that enable the circuit board sheet to be bent and broken along the separation line.

26. The sheet according to claim 25, wherein
a first region provided on the first surface of the first printed circuit board and a second region provided on the second surface of the second printed circuit board are arranged so as to be line-symmetrical relative to the separation line; and
a first connector is soldered to the first region, and no connector is mounted in the second region.

27. The sheet according to claim 25, wherein
a first region provided on the first surface of the first printed circuit board and a second region provided on the second surface of the second printed circuit board are arranged on respective sides of the separation line;
the first connector is disposed in the first region, and the second connector is disposed in the second region; and
the first connector and the second connector are disposed so that in the step of separating the first printed circuit board from the second printed circuit board, the circuit board sheet breaks before the first connector and the second connector can make contact with each other when the circuit board sheet is bent along the separation line.

28. The sheet according to claim 27, wherein
a direction in which a cable is connected to the first connector is parallel to the normal direction of the first surface of the first printed circuit board;
a direction in which a cable is connected to the second connector is orthogonal to the normal direction of the second surface of the second printed circuit board; and
a cable connection opening of the second connector faces a side surface of the first connector.

* * * * *